US012787568B2

(12) United States Patent
Park et al.

(10) Patent No.: US 12,787,568 B2
(45) Date of Patent: Nov. 3, 2026

(54) TRANSPARENT DISPLAY APPARATUS WITH SLIT OVERLAPPING GIP LINES

(71) Applicant: LG Display Co., Ltd., Seoul (KR)

(72) Inventors: Sunghee Park, Paju-si (KR); SungHak Jo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 991 days.

(21) Appl. No.: 17/868,240

(22) Filed: Jul. 19, 2022

(65) Prior Publication Data

US 2023/0111042 A1 Apr. 13, 2023

(30) Foreign Application Priority Data

Sep. 30, 2021 (KR) ........................ 10-2021-0129918

(51) Int. Cl.

*H10K 59/131* (2023.01)
*H10K 59/80* (2023.01)
*H10K 59/88* (2023.01)

(52) U.S. Cl.

CPC ....... *H10K 59/131* (2023.02); *H10K 59/8791* (2023.02); *H10K 59/88* (2023.02)

(58) Field of Classification Search

CPC ....... H10K 59/131; H10K 59/88; H10K 50/86
See application file for complete search history.

(56) References Cited

U.S. PATENT DOCUMENTS 8,797,239 B2 8/2014 Yoon et al.
2017/0110521 A1* 4/2017 Park .................... H10K 59/124
2021/0026419 A1* 1/2021 Kim ...................... G01S 7/4813
2021/0098737 A1 4/2021 Pang et al.
2021/0202628 A1 7/2021 Kim et al.
2021/0202683 A1* 7/2021 Lee .................... H10K 59/1315
2021/0210582 A1 7/2021 Lee et al.
2022/0199031 A1 6/2022 Jo et al.

FOREIGN PATENT DOCUMENTS

| | | | |
|---|---|---|---|
| CN | 110634928 | A | 12/2019 |
| CN | 110890474 | A | 3/2020 |
| CN | 111477109 | A | 7/2020 |
| CN | 112582445 | A | 3/2021 |
| CN | 113130575 | A | 7/2021 |
| CN | 113130576 | A | 7/2021 |
| EP | 4020454 | A1 | 6/2022 |
| KR | 10-2011-0101778 | A | 9/2011 |
| KR | 20180032255 | A | 3/2018 |
| KR | 20210085135 | A | 7/2021 |

* cited by examiner

*Primary Examiner* — Lex H Malsawma

(74) *Attorney, Agent, or Firm* — Seed Intellectual Property Law Group LLP

(57) ABSTRACT

A transparent display apparatus is provided, which reduces a visibility difference between a display area and a non-display area and has excellent encapsulation characteristics. The transparent display apparatus comprises a substrate having a display area and a non-display area adjacent to the display area, a plurality of pixels disposed in the display area, having a first transmissive portion, a plurality of second transmissive portions provided in the non-display area, and a slit portion disposed between the plurality of second transmissive portions.

28 Claims, 10 Drawing Sheets

TRANSPARENT DISPLAY APPARATUS WITH SLIT OVERLAPPING GIP LINES

CROSS-REFERENCE TO RELATED APPLICATIONS

This application claims the benefit of the Korean Patent Application No. 10-2021-0129918 filed on Sep. 30, 2021, which are hereby incorporated by reference as if fully set forth herein.

BACKGROUND

Technical Field

The present disclosure relates to a transparent display apparatus.

Description of the Related Art

With the advancement of the information age, the demand for a display device for displaying an image has increased in various forms. Therefore, various types of display devices such as a liquid crystal display (LCD) device, a plasma display panel (PDP) device, an organic light emitting display (OLED) device and a quantum dot light emitting display (QLED) device have been recently used.

Recently, studies for a transparent display apparatus in which a user may view objects or images positioned at an opposite side by transmitting through the display apparatus are actively ongoing. The transparent display apparatus includes a display area on which an image is displayed and a non-display area that includes a bezel area, wherein the display area may include a transmissive area capable of transmitting external light through it and a non-transmissive area having a light emission area.

The transparent display apparatus may be manufactured by bonding a lower substrate having a light emission area and a transmissive area to an upper substrate disposed to face the lower substrate by using an opaque adhesive. Since the opaque adhesive is positioned in the non-display area, when a plurality of transparent display apparatuses are disposed to be adjacent to each other, it disrupts uniformity of the transparent display apparatuses.

Therefore, a transparent adhesive is used instead of the opaque adhesive positioned in the non-display area and circuits positioned in the non-display area are changed to be transparent so as to improve uniformity, but there is a problem of a visibility difference between the non-display area and the display area due to a different structure (for example, there is no planarization layer in the non-display area unlike the display area) between the non-display area and the display area.

In this respect, although studies for providing a planarization layer even in the non-display area is ongoing, but a problem occurs in that reliability of the transparent display apparatus is deteriorated due to permeation of external water into the transparent display apparatus.

BRIEF SUMMARY

The inventors have realized that water might permeate into the display through the planarization layer when the planarization layer made of an organic layer is disposed in the non-display area adjacent to the outside. The present disclosure has been formed to resolve the above problems, and in particular to block the movement of moisture from the outside to the display area. One object of the present disclosure to provide a transparent display apparatus that reduces a visibility difference between a non-display area and a display area and has excellent encapsulation characteristics. Another object is to provide a structure in the non-display area that blocks the movement of water into the display area that is made in the same process and uses some of the same layers that are present in the display area.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a transparent display apparatus comprising a substrate having a display area and a non-display area adjacent to the display area, a plurality of pixels disposed in the display area, having a first transmissive portion, a plurality of second transmissive portions provided in the non-display area, and a slit portion disposed between the plurality of second transmissive portions.

In accordance with another aspect of the present disclosure, the above and other objects can be accomplished by the provision of a transparent display apparatus comprising a substrate having a display area having a plurality of first transmissive portions and a non-display area having a plurality of second transmissive portions near the display area, a plurality of power lines or a plurality of dummy patterns, which are disposed between the plurality of second transmissive portions, and a slit portion partially overlapped with the plurality of power lines or the plurality of dummy patterns.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
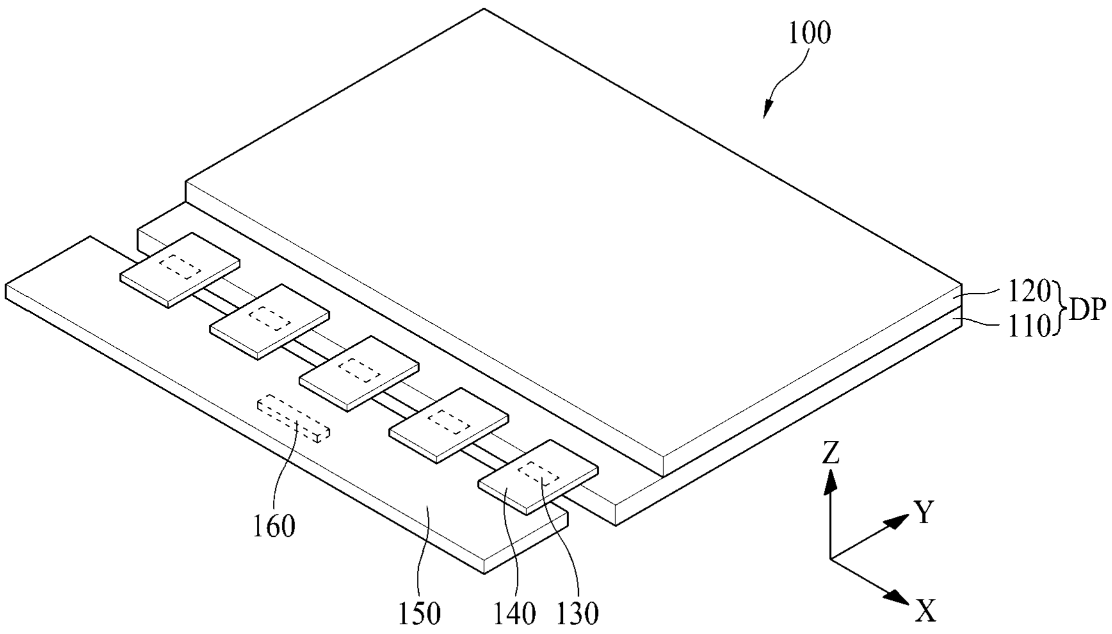
FIG. 1 is a perspective view illustrating a transparent display apparatus according to one embodiment of the present disclosure.

Reference will now be made in detail to the embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings.

The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. The drawings show the various layers, structures and material in the correct proportion relative to each with respect to their size, shape and location. The drawings and the relative size, shape, location, dimensions and structure therefore form a part of this disclosure. Like reference numerals refer to like elements throughout. In the following description, when the detailed description of the relevant known function or configuration is determined to unnecessarily obscure the important point of the present disclosure, the detailed description will be omitted.

In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~,' 'over~,' 'under~,' and 'next~,' one or more other parts may be disposed between the two parts unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

"X-axis direction," "Y-axis direction" and "Z-axis direction" should not be construed by a geometric relation only of a mutual vertical relation and may have broader directionality within the range that elements of the present disclosure may act functionally.

The term "at least one" should be understood as including any and all combinations of one or more of the associated listed items. For example, the meaning of "at least one of a first item, a second item and a third item" denotes the combination of all items proposed from two or more of the first item, the second item and the third item as well as the first item, the second item or the third item.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in co-dependent relationship.

Hereinafter, the preferred embodiments of the present disclosure will be described in detail with reference to the accompanying drawings.

Figure 2:
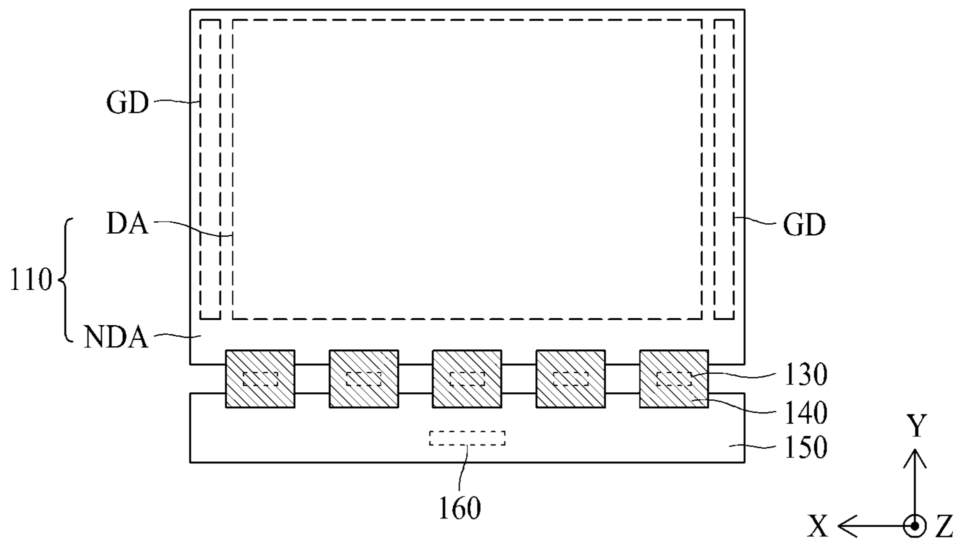
FIG. 2 is a plan view illustrating a first substrate, a source drive IC, a flexible film, a circuit board and a timing controller of FIG. 1.
Figure 3:
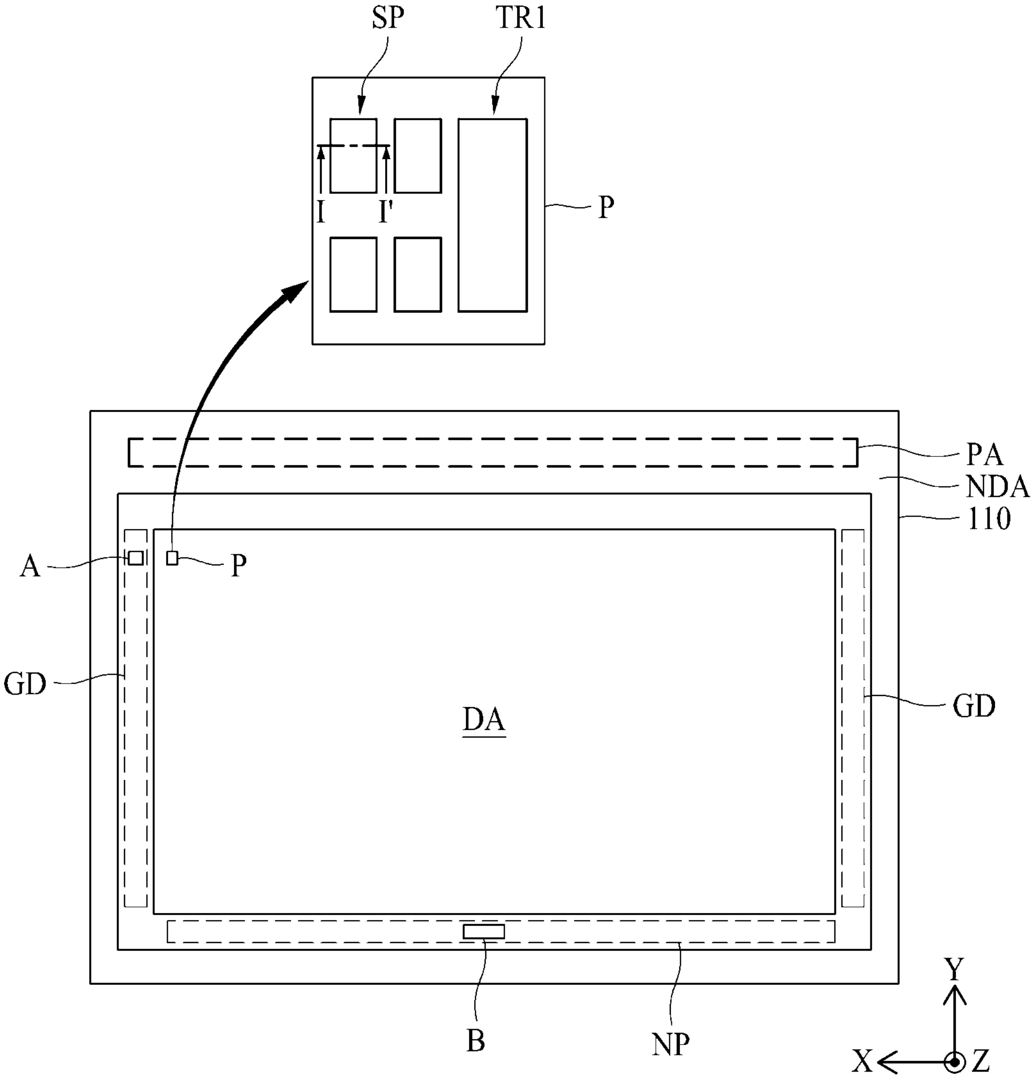
FIG. 3 is a schematic plan view illustrating the first substrate.
Figure 4:
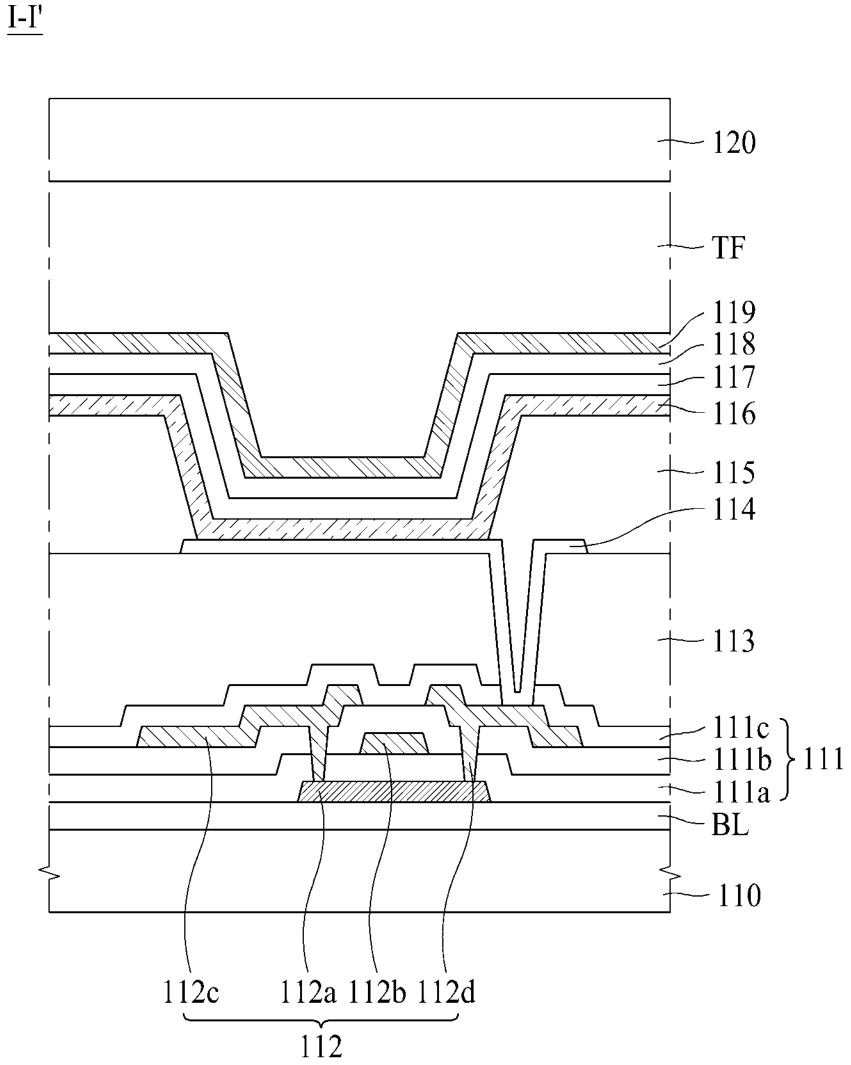
FIG. 4 is a schematic cross-sectional view taken along line I-I' shown in FIG. 3.
Figure 5:
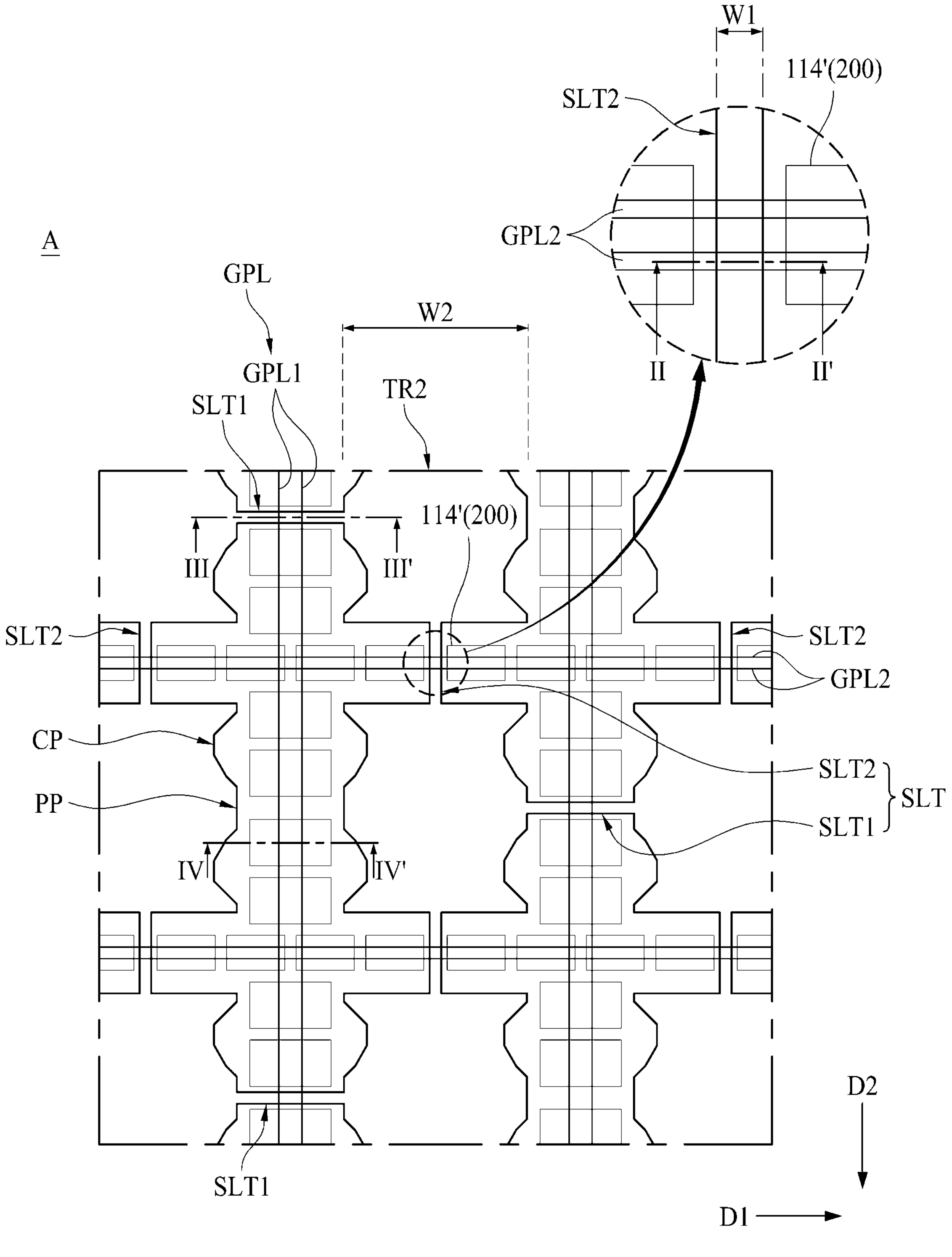
FIG. 5 is a schematic enlarged view illustrating a portion A of FIG. 3.
Figure 6:
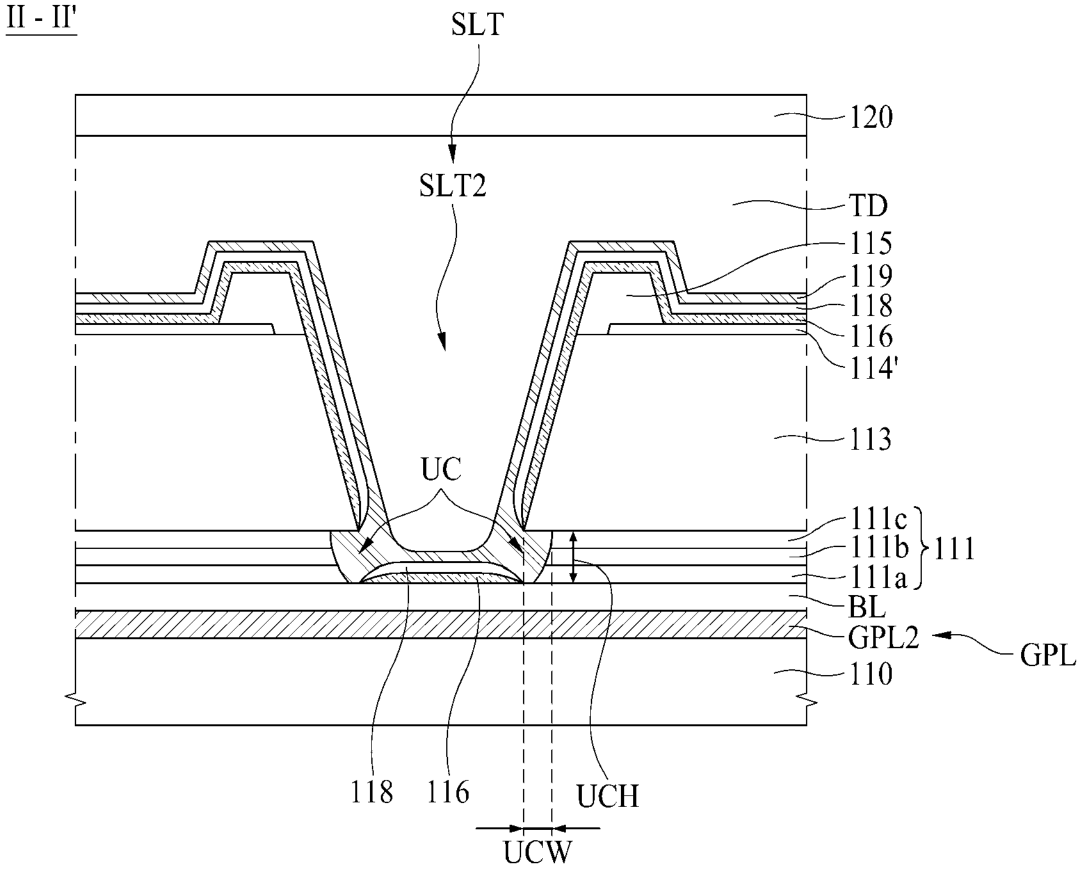
FIG. 6 is a schematic cross-sectional view taken along line II-II' shown in FIG. 5.
Figure 7:
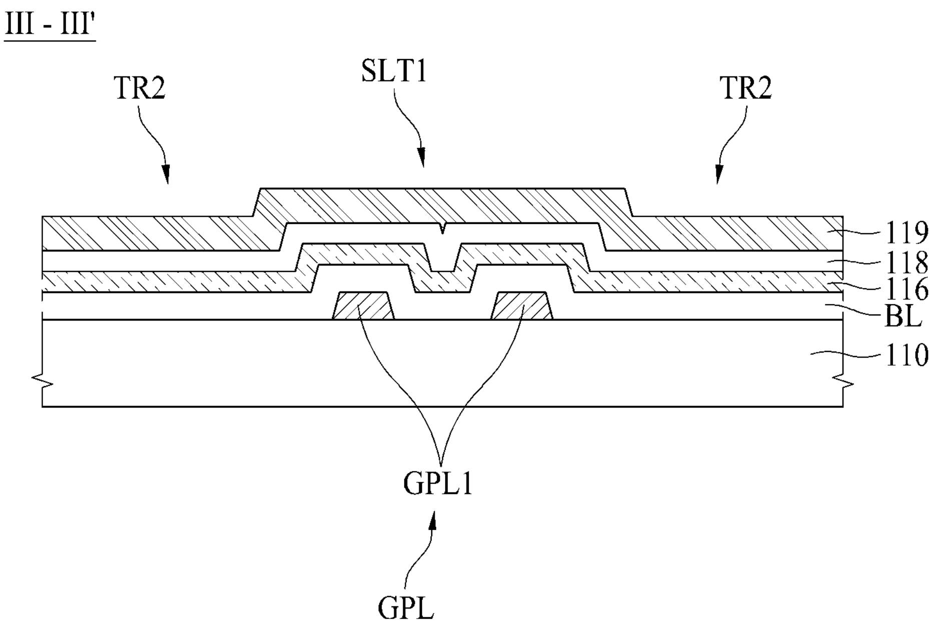
FIG. 7 is a schematic cross-sectional view taken along line III-III' shown in FIG. 5.

FIG. 1 is a perspective view illustrating a transparent display apparatus according to one embodiment of the present disclosure, FIG. 2 is a plan view illustrating a first substrate, a source drive IC, a flexible film, a circuit board and a timing controller of FIG. 1, FIG. 3 is a schematic plan view illustrating the first substrate, FIG. 4 is a schematic cross-sectional view taken along line I-I' shown in FIG. 3, FIG. 5 is a schematic enlarged view illustrating a portion A of FIG. 3, FIG. 6 is a schematic cross-sectional view taken along line II-II' shown in FIG. 5 and FIG. 7 is a schematic cross-sectional view taken along line III-III' shown in FIG. 5.

Hereinafter, the following description will be based on that a transparent display apparatus 100 according to one embodiment of the present disclosure is an organic light emitting display apparatus, but is not limited thereto. That is, the transparent display apparatus according to one embodiment of the present disclosure may be implemented as any one of a liquid crystal display apparatus, a field emission display apparatus, a quantum dot lighting emitting diode apparatus and an electrophoretic display apparatus as well as the organic light emitting display apparatus.

Referring to FIGS. 1 to 7, the display apparatus 100 according to one embodiment of the present disclosure may include a display panel DP having a gate driver GD, a source drive integrated circuit (hereinafter, referred to as "IC") 130, a flexible film 140, a circuit board 150 and a timing controller 160.

The display panel DP may include a substrate 110 and an opposite substrate 120, which are bonded to each other.

The substrate 110 may include a thin film transistor and may be a transistor array substrate, a lower substrate, a base substrate or a first substrate. The substrate 110 may be a transparent glass substrate or a transparent plastic substrate. For example, the substrate 110 may be a transparent glass substrate. Hereinafter, the substrate 110 will be defined or referred to as a first substrate.

The opposite substrate 120 may be bonded to the first substrate 110. For example, the opposite substrate 120 may have a size smaller than that of the first substrate 110 and may be bonded to the remaining portion except the pad area PA of the first substrate 110. The opposite substrate 120 may be an upper substrate, a second substrate or an encapsulation substrate. The opposite substrate 120 may be bonded to a first surface of the first substrate 110 by a substrate bonding process using an adhesive member (or transparent adhesive). Hereinafter, the opposite substrate 120 will be defined or referred to as a second substrate.

The first substrate 110 according to an example may include a display area DA and a non-display area NDA.

The display area DA is an area where an image is displayed and may be a pixel array area, an active area, a pixel array unit, a display unit or a screen. For example, the display area DA may be disposed at a central portion of the display panel DP.

The display area DA according to an example may include gate lines, data lines, pixel driving power lines and a plurality of pixels P. Each of the plurality of pixels P may include a plurality of subpixels SP that may be positioned in the same region as the gate lines and the data lines and a first transmissive portion TR1 disposed to be adjacent to some or all of the plurality of subpixels SP. The first transmissive portion TR1 is an area provided to allow light to transmit front and rear surfaces of the display panel DP. Therefore, a user positioned in the direction of the front surface of the display panel DP may view an image or background positioned in the direction of the rear surface of the display panel DP through the first transmissive portion TR1.

Each of the plurality of subpixels SP may be defined or referred to as a minimum unit area in which light is actually emitted.

According to an example, at least four subpixels disposed to be adjacent to one another among the plurality of subpixels SP or four subpixels disposed to be adjacent to one another along a longitudinal direction of the gate line (or data line) and one first transmissive portion TR1 constitute one unit pixel. One unit pixel may include, but is not limited to, a red subpixel, a green subpixel, a blue subpixel, a white subpixel and a first transmissive portion TR1. As an example, one unit pixel may include at least one red subpixel, at least one green subpixel, at least one blue subpixel, at least one white subpixel and at least one first transmissive portion TR1.

According to another example, three subpixels disposed to be adjacent to one another among the plurality of subpixels SP or three subpixels disposed to be adjacent to one another along the longitudinal direction of the gate line (or data line) and one first transmissive portion TR1 constitute one unit pixel. One unit pixel may include, but is not limited to, at least one red subpixel, at least one green subpixel, at least one blue subpixel and one first transmissive portion TR1.

Each of the plurality of subpixels SP includes a thin film transistor and a light emitting portion connected to the thin film transistor. The light emitting portion may include a light emitting element layer (or organic light emitting layer) interposed between a first electrode and a second electrode.

The light emitting element layers respectively disposed in the plurality of subpixels SP may individually emit light of their respective colors different from one another or commonly emit white light. According to an example, when the light emitting element layers of the plurality of subpixels SP commonly emit white light, each of the red subpixel, the green subpixel and the blue subpixel may include a color filter (or wavelength conversion member) for converting white light into light of its respective different color. In this case, the white subpixel according to an example may not include a color filter. At least a portion of the white subpixel according to another example may include the same color filter as any one of the red subpixel, the green subpixel and the blue subpixel.

Each of the subpixels SP supplies a predetermined or selected current to the organic light emitting element in accordance with a data voltage of the data line when a gate signal is input from the gate line by using the thin film transistor. For this reason, the light emitting portion of each of the subpixels may emit light with a predetermined or selected brightness in accordance with the predetermined or selected current. A structure of each of the subpixels SP will be described later with reference to FIG. 4.

The non-display area NDA may be an area where an image is not displayed, and may be a peripheral circuit area, a signal supply area, a non-active area or a bezel area. The non-display area NDA may be configured to be around the display area DA. That is, the non-display area NDA may be disposed to be adjacent to or, in some instances, surround the display area DA.

The transparent display apparatus 100 according to one embodiment of the present disclosure may include a plurality of second transmissive portions TR2 and a slit portion SLT, which are provided in the non-display area NDA.

Each of the second transmissive portions TR2 is an area provided to allow light to transmit the front and rear surfaces of the display panel DP like the first transmissive portion TR1. Therefore, a user located in the direction of the front surface of the display panel DP may view an image or background positioned in the direction of the rear surface of the display panel DP even through the second transmissive portions TR2 provided in the non-display area NDA.

As a result, since the transparent display apparatus 100 according to one embodiment of the present disclosure may transmit an image or background disposed in the direction of the front surface or the rear surface of the display panel DP through the first transmissive portion TR1 provided in the display area DA and the second transmissive portions TR2 provided in the non-display area NDA, light transmittance may be more improved than the case that the transmissive portion is provided only in the display area.

In addition, in the transparent display apparatus 100 according to one embodiment of the present disclosure, as the second transmissive portion TR2 is provided in the non-display area NDA in the same manner that the first transmissive portion TR1 is provided in the display area DA, the display area DA and the non-display area NDA are provided in a similar structure, whereby a visibility difference between the display area DA and the non-display area NDA may be reduced and thus characteristics of visibility of the entire screen may be prevented from being deteriorated.

The slit portion SLT may be disposed in the non-display area NDA. The slit portion SLT may disconnect an organic layer (or organic material) such as a flat portion 113 or an organic light emitting layer, which is provided in the non-display area NDA. Therefore, the slit portion SLT may prevent external water or moisture from being permeated from the non-display area NDA to the display area DA through the organic layer.

The transparent display apparatus 100 according to one embodiment of the present disclosure may include a plurality of slit portions SLT in the non-display area NDA. Therefore, the transparent display apparatus 100 according to one embodiment of the present disclosure may prevent moisture permeation of the non-display area NDA or lengthen a moisture permeation path, thereby improving reliability.

The transparent display apparatus 100 according to one embodiment of the present disclosure may include a flat portion 113 provided in the non-display area NDA. The flat portion 113 may be disposed between the plurality of second transmissive portions TR2. The reason why the flat portion 113 is disposed in the non-display area NDA is to reduce a visibility difference between the non-display area NDA and the display area DA by forming a structure the same as or similar to that of the display area DA. For example, in the transparent display apparatus 100 according to one embodiment of the present disclosure, since the flat portion 113 made of an organic material is provided between a circuit element layer 111 and the light emitting element (or first electrode 114) of the display area DA as shown in FIG. 4, the flat portion 113 made of either an inorganic or an organic planarizing layer that is also provided between the circuit element layer 111 and a dummy electrode 114' in the non-display area NDA as shown in FIG. 6, whereby the visibility difference between the display area DA and the non-display area NDA may be reduced.

Meanwhile, since the non-display area NDA is disposed near the display area DA, i.e., at the edge of the display panel DP that is in contact with the outside, external moisture or water may be permeated into the display area DA through the non-display area. As described above, when the flat portion 113 made of the organic material is disposed in the non-display area NDA, external water may be permeated into the display area DA through the flat portion 113 of the non-display area NDA, whereby reliability of the display panel DP may be deteriorated.

Therefore, in the transparent display apparatus 100 according to one embodiment of the present disclosure, a plurality of slit portions SLT for disconnecting the flat portion 113 are provided in the non-display area NDA, whereby moisture permeation through the flat portion 113 of the non-display area NDA may be avoided.

The plurality of slit portions SLT according to an example may be formed as the flat portion 113, which is provided between a plurality of dummy electrodes 114' (shown in FIG. 5), among the plurality of flat portions 113 disposed in the non-display area NDA is removed through exposure and etching processes. Therefore, each of the plurality of slit portions SLT may prevent external water from being permeated into the display area DA through the flat portion 113 disposed in the non-display area NDA. Regarding this, a detailed description will be described later with reference to FIGS. 5 and 6.

Referring to FIGS. 2 and 3, the non-display area NDA may be disposed at an edge portion of the display panel DP. The non-display area NDA according to an example may include first, second, third and fourth (first to fourth) non-display areas disposed at an edge portion of the first substrate 110. For example, the non-display area NDA may include a first non-display area disposed on or being in contact with a first side of the display area DA, a second non-display area disposed on or being in contact with a second side of the display area DA, a third non-display area disposed on or being in contact with a third side of the display area DA, which is parallel with the second side of the display area DA, and a fourth non-display area disposed on or being in contact with a fourth side of the display area DA, which is parallel with the first side of the display area DA. For example, each of the first and fourth non-display areas may be parallel with a first direction X, and each of the second and third non-display areas may be parallel with a second direction Y crossing (or perpendicular to) the first direction X.

Any one of the non-display areas NDA may include a pad area PA. The pad area PA may be disposed on at least one of the first to fourth non-display areas exposed to the outside without being covered by the second substrate 120 of the non-display area NDA. For example, the pad area may be disposed in the first non-display area. In this case, as shown in FIG. 3, the gate driver GD may be disposed in the second and third non-display areas. A power sharing line for supplying a power source to the display area DA may be disposed in the fourth non-display area. The fourth non-display area may be a non-pad portion NP in which the pad area PA is not disposed.

A plurality of pads (not shown) may be disposed to be spaced apart from each other along the first direction X in the pad area PA. Each of the plurality of pads may include a plurality of data pads, at least one pixel driving power pad, and a plurality of common power pads.

The gate driver GD supplies gate signals to the gate lines in accordance with the gate control signal input from the timing controller 160. The gate driver GD may be formed on one side of the display area DA of the display panel DP or on the non-display area NDA outside both sides of the display area DA in a gate driver in panel (GIP) method as shown in FIG. 3. Alternatively, the gate driver GD may be manufactured as a driving chip, packaged in a flexible film and attached to the non-display area NDA outside one side or both sides of the display area DA of the display panel DP by a tape automated bonding (TAB) method. The gate driver GD may include a plurality of gate driving circuits. The gate driver GD may include a plurality of gate driving circuits (or GIP circuit) 200 (shown in FIG. 5).

The plurality of gate driving circuits may be divisionally disposed on a left side of the display area DA, that is, the second non-display area and on a right side of the display area DA, that is, the third non-display areas based on FIG. 3. According to an example, the gate driving circuit disposed in the second non-display area may be electrically connected to each of the gate lines disposed in the display area DA, and the gate driving circuit disposed in the third non-display area may be electrically connected to each of the gate lines disposed in the display area DA. For example, the gate driving circuit of the second non-display area may be connected to one side of each of the gate lines, and the gate driving circuit of the third non-display area may be connected to the other side of each of the gate lines.

According to another example, the gate driving circuit of the second non-display area may be electrically connected to each of the odd-numbered (or even-numbered) gate lines of the gate lines disposed in the display area DA, and the gate driving circuit of the third non-display area may be electrically connected to each of the even-numbered (or odd-numbered) gate lines of the gate lines disposed in the display area DA. For example, the gate driving circuit of the second non-display area may be connected to one side of each of the odd-numbered gate lines, and the gate driving circuit of the third non-display area may be connected to the other side of each of the even-numbered gate lines.

The plurality of gate driving circuits 200 may output gate control signals supplied from the plurality of pads and gate signals sequentially shifted based on gate circuit driving power sources. The plurality of gate driving circuits 200 may be disposed below the dummy electrode 114' as shown in FIG. 5. Therefore, the plurality of gate driving circuits 200 may overlap the dummy electrodes 114'. Since the dummy electrode 114' may cover the plurality of gate driving circuits 200 from external light, reflection of external light by the plurality of gate driving circuits 200 may be reduced or avoided.

Meanwhile, the plurality of gate driving circuits 200 according to an example may include a plurality of TFTs, a plurality of clock signal lines, and a plurality of signal lines. The plurality of gate driving circuits 200 may be connected to a plurality of GIP lines GPL. The plurality of GIP lines GPL may be connected to the gate line provided in the pixel P.

In the transparent display apparatus 100 according to one embodiment of the present disclosure, the plurality of slit portions SLT are disposed on the gate driver GD, and at least a portion of each of the plurality of slit portions SLT may overlap at least one of the plurality of GIP lines GPL. The plurality of GIP lines GPL disposed in the gate driver GD may be disposed so as not to overlap the second transmissive portion TR2 in order to prevent transmittance of the second transmissive portion TR2 from being reduced. Therefore, at least one of the plurality of GIP lines GPL may overlap at least a portion of each of the plurality of slit portions SLT disposed between the second transmissive portions TR2, as shown in FIG. 5. The overlap means overlap in a minimum thickness direction of the first substrate 110, and may include partial overlap.

The source drive IC 130 (shown in FIG. 2) receives digital video data and a source control signal from the timing controller 160. The source drive IC 130 converts the digital video data into analog data voltages in accordance with the source control signal and supplies the analog data voltages to the data lines. When the source drive IC 130 is manufactured as a driving chip, the source drive IC 130 may be packaged in the flexible film 140 in a chip on film (COF) method or a chip on plastic (COP) method.

Pads, such as data pads, may be formed in the non-display area NDA of the display panel DP. Lines connecting the pads with the source drive IC 130 and lines connecting the pads with lines of the circuit board 150 may be formed in the flexible film 140. The flexible film 140 may be attached onto the pads by using an anisotropic conducting film, whereby the pads may be connected with the lines of the flexible film 140.

The circuit board 150 may be attached to the flexible films 140. A plurality of circuits implemented as driving chips may be packaged in the circuit board 150. For example, the timing controller 160 may be packaged in the circuit board 150. The circuit board 150 may be a printed circuit board or a flexible printed circuit board.

The timing controller 160 receives the digital video data and a timing signal from an external system board through a cable of the circuit board 150. The timing controller 160 generates a gate control signal for controlling an operation timing of the gate driver GD and a source control signal for controlling the source drive ICs 130 based on the timing signal. The timing controller 160 supplies the gate control signal to the gate driver GD, and supplies the source control signal to the source drive ICs 130.

Referring to FIG. 3, the first transmissive portion TR1 may be disposed to be adjacent to at least a portion of the plurality of subpixels SP, and may be included in one pixel P. Since the plurality of pixels P are provided in the display area DA, a plurality of the first transmissive portions TR1 may be provided in the display area DA. Although the first transmissive portion TR1 is illustrated as being provided in a rectangular shape in FIG. 3, the first transmissive portion TR1 is not limited thereto. The first transmissive portion TR1 may be provided in various shapes. For example, the first transmissive portion TR1 may be provided in a form including a concave portion and a convex portion, in the same manner as the second transmissive portion TR2 shown in FIG. 5.

Likewise, the second transmissive portion TR2 according to an example may be provided in the same form as that of the first transmissive portion TR1. In this case, the same form means the same shape, and is not intended to mean the same size (or area). However, the present disclosure is not necessarily limited to this example, and the second transmissive portion TR2 may be provided not only in the same shape but also in the same size (or area) as that of the first transmissive portion TR1.

The transparent display apparatus 100 according to one embodiment of the present disclosure is provided such that the second transmissive portion TR2 is disposed in the non-display area NDA, so that overall light transmittance may be improved, and a visibility difference between the display area DA and the non-display area NDA may be reduced. In more detail, since the first transmissive portion TR1 of each of the plurality of pixels P is disposed in the display area DA and the second transmissive portion TR2 is disposed in the non-display area NDA, transmittance of the transparent display apparatus 100 may be improved and the visibility difference between the display area DA and the non-display area NDA may be reduced. Therefore, a user located in the direction of the front surface of the transparent display apparatus 100 according to one embodiment of the present disclosure may view a background or image (background or image positioned in the direction of the rear surface of the transparent display apparatus 100) having improved visibility without a gap between the display area DA and the non-display area NDA.

In addition, in the transparent display apparatus 100 according to one embodiment of the present disclosure, as the second transmissive portion TR2 is provided to have the same shape as that of the first transmissive portion TR1, the visibility difference between the display area DA and the non-display area NDA may be further reduced, whereby a user may more integrally view a background or image through the display area DA and the non-display area NDA.

Hereinafter, a subpixel SP of the display apparatus 100 according to one embodiment of the present disclosure will be described with reference to FIGS. 3 and 4.

Referring to FIGS. 3 and 4, the display apparatus 100 according to one embodiment of the present disclosure may include a buffer layer BL disposed over the first substrate 110, preventing water from being permeated into the thin film transistor 112.

In addition, each of the subpixels SP according to one embodiment of the present disclosure may include a circuit element layer 111 provided on an upper surface of the buffer layer BL, including a gate insulating layer 111*a*, an interlayer insulating layer 111*b*, a protective layer 111*c*, and a thin film transistor 112, a flat portion 113 provided over the circuit element layer 111, a first electrode 114 provided on the flat portion 113, a bank 115, an organic light emitting layer 116, a second electrode 117, a capping layer 118, and an encapsulation layer 119. The first electrode 114, the organic light emitting layer 116, and the second electrode 117 may be included in the light emitting element.

The buffer layer BL may be formed between the first substrate 110 and the circuit element layer 111 (or gate insulating layer 111*a*) to protect the thin film transistor 112. The buffer layer BL may be disposed entirely on one surface (or front surface) of the first substrate 110. The buffer layer BL may serve to prevent a material contained in the first substrate 110 from being diffused into a transistor layer during a high temperature process of the manufacturing process of the thin film transistor. Optionally, the buffer layer BL may be omitted as the case may be.

The circuit element layer 111 may include a gate insulating layer 111*a*, an interlayer insulating layer 111*b*, a protective layer 111*c*, and a thin film transistor 112. The gate insulating layer 111*a*, the interlayer insulating layer 111*b* and the protective layer 111*c* may be included in an inorganic layer portion.

The thin film transistor 112 according to an example may include an active layer 112*a*, a gate electrode 112*b*, a source electrode 112*c*, and a drain electrode 112*d*.

The active layer 112*a* may include a channel area, a drain area and a source area, which are formed in a thin film transistor area of a circuit area of the pixel P. The drain area and the source area may be spaced apart from each other with the channel area interposed therebetween.

The active layer 112*a* may be formed of a semiconductor material based on any one of amorphous silicon, polycrystalline silicon, oxide and organic material.

The gate insulating layer 111*a* may be formed on the channel area of the active layer 112*a*. As an example, the gate insulating layer 111*a* may be formed in an island shape only on the channel area of the active layer 112*a*, or may be formed on an entire front surface of the first substrate 110 or the buffer layer BL, which includes the active layer 112*a*.

The gate electrode 112*b* may be formed on the gate insulating layer 111*a* to overlap the channel area of the active layer 112*a*.

The interlayer insulating layer 111*b* may be formed on the gate electrode 112*b* and the drain area and the source area of the active layer 112*a*. The interlayer insulating layer 111*b* may be formed in the circuit area and an entire light emission area, in which light is emitted to the pixel P. For example, the interlayer insulating layer 111*b* may be made of an inorganic material, but is not necessarily limited thereto.

The source electrode 112*c* may be electrically connected to the source area of the active layer 112*a* through a source contact hole provided in the interlayer insulating layer 111*b* overlapped with the source area of the active layer 112*a*.

The drain electrode 112*d* may be electrically connected to the drain area of the active layer 112*a* through a drain contact hole provided in the interlayer insulating layer 111*b* overlapped with the drain area of the active layer 112*a*.

The drain electrode 112*d* and the source electrode 112*c* may be made of the same metal material. For example, each of the drain electrode 112*d* and the source electrode 112*c* may be made of a single metal layer, a single layer of an alloy or a multi-layer of two or more layers, which is the same as or different from that of the gate electrode.

In addition, the circuit area may further include first and second switching thin film transistors disposed together with the thin film transistor 112, and a capacitor. Since each of the first and second switching thin film transistors is provided over the circuit area of the pixel P to have the same structure as that of the thin film transistor 112, its description will be omitted. The capacitor may be provided in an overlap area between the gate electrode 112*b* and the source electrode 112*c* of the thin film transistor 112, which overlap each other with the interlayer insulating layer 111*b* interposed therebetween.

Additionally, in order to prevent a threshold voltage of the thin film transistor provided in a pixel area from being shifted by light, the display panel or the first substrate 110 may further include a light shielding layer (not shown) provided below the active layer 112*a* of at least one of the thin film transistor 112, the first switching thin film transistor or the second switching thin film transistor. The light shielding layer may be disposed between the first substrate 110 and the active layer 112*a* to shield light incident on the active layer 112*a* through the first substrate 110, thereby minimizing a change in the threshold voltage of the transistor due to external light.

The protective layer 111*c* may be provided over the first substrate 110 to cover the pixel area in which the pixel P is disposed. The protective layer 111*c* covers the drain electrode 112*d* and the source electrode 112*c* of the thin film transistor 112 and the interlayer insulating layer 111*b*. The protective layer 111*c* may be entirely formed in the circuit area and the light emission area. For example, the protective layer 111*c* may be expressed as a passivation layer. The protective layer 111*c* may be omitted.

The gate insulating layer 111*a*, the interlayer insulating layer 111*b*, and the protective layer 111*c* may be included in an inorganic layer made of an inorganic material.

The flat portion 113 may be formed over the first substrate 110 to cover the protective layer 111*c*. When the protective layer 111*c* is omitted, the flat portion 113 may be provided over the first substrate 110 to overlay the circuit area. The flat portion 113 may be formed entirely in the circuit area and the light emission area. In addition, the flat portion 113 may be formed on the other area except the pad area PA in the non-display area NDA and the entire display area DA. For example, the flat portion 113 may include an extension portion (or enlarged portion) extended or enlarged from the display area DA to the other non-display area NDA except the pad area PA. Therefore, the flat portion 113 may have a size relatively wider than that of the display area DA. As described above, in the transparent display apparatus 100 according to one embodiment of the present disclosure, the flat portion 113 may be disposed even in the non-display area NDA. The flat portion 113 disposed in the non-display area NDA may be made of the same material as that of the flat portion 113 provided in the display area DA. Therefore, the visibility difference between the non-display area NDA and the display area DA may be reduced. Also, the flat portion disposed in the non-display area NDA may be formed to be positioned in the same layer as the flat portion 113 provided in the display area DA through the same process as that of the flat portion 113.

The flat portion 113 according to an example may be formed to be relatively thick, and thus may provide a flat surface over the display area DA. For example, the flat portion 113 may be made of an organic material such as photo acryl, benzocyclobutene, polyimide, and fluorine resin.

The first electrode 114 may be formed on the flat portion 113. The first electrode 114 is connected to the drain electrode or the source electrode of the thin film transistor 112 through a contact hole that passes through the flat portion 113 and the protective layer 111*c*.

The first electrode 114 may be made of at least one of a transparent metal material, a semi-transmissive metal material, or a metal material having high reflectance.

When the transparent display apparatus 100 is provided in a top emission mode, the first electrode 114 may be formed of a metal material having high reflectance or a stacked structure of a metal material having high reflectance and a transparent metal material. For example, the first electrode 114 may be formed of a metal material having high reflectance, such as a stacked structure (Ti/Al/Ti) of aluminum and titanium, a stacked structure (ITO/Al/ITO) of aluminum and ITO, an Ag alloy, and a stacked structure (ITO/Ag alloy/ITO) of Ag alloy and ITO. The Ag alloy may be an alloy such as silver (Ag), palladium (Pd), and copper (Cu).

When the transparent display apparatus 100 is provided in a bottom emission mode, the first electrode 114 may be formed of a transparent conductive material (TCO) such as ITO and IZO, which may transmit light, or a semi-transmissive conductive material such as magnesium (Mg), silver (Ag) or an alloy of magnesium (Mg) and silver (Ag).

Meanwhile, the material constituting the first electrode 114 may include MoTi. The first electrode 114 may be an anode electrode.

The bank 115 is a non-light emission area in which light is not emitted, and may be provided to be adjacent to and in some instances laterally surround each of light emission areas (or light emitting portions) of the plurality of subpixels SP. That is, the bank 115 may partition (or define) the respective light emission areas (or light emitting portions).

The bank 115 may be formed on the flat portion 113 to cover an edge of the first electrode 114, thereby partitioning (or defining) the light emission areas (or light emitting portions) of the plurality of subpixels SP.

The bank 115 may be formed to cover the edge of the first electrode 114 of each of the subpixels SP and expose a portion of each of the first electrodes 114. Therefore, a current is concentrated on an end of each of the first electrodes 114 to avoid a problem in which light emitting efficiency is degraded. An exposed portion of the first electrode 114 that is not covered by the bank 115 may be a light emission area (or light emitting portion).

The bank 115 may be formed of an organic layer such as an acrylic resin, an epoxy resin, a phenolic resin, a polyamide resin, and a polyimide resin, but is not limited thereto.

The bank 115 may be provided in the non-display area NDA to partially cover each of the plurality of dummy electrodes 114' provided on the same layer (or upper surface of the flat portion 113) as the first electrode 114 in the non-display area NDA. For example, the bank 115 of the non-display area NDA may be provided to cover the edge of each of the plurality of dummy electrodes 114'. The plurality of dummy electrodes 114' may be provided in the non-display area NDA to improve the visibility difference between the non-display area NDA and the display area DA. Since no power source is supplied to the plurality of dummy electrodes 114' provided in the non-display area NDA, the current may not be concentrated on the end. Therefore, the bank 115 provided in the non-display area NDA may be provided in the non-display area NDA to reduce the visibility difference with the display area DA.

In addition, the plurality of dummy electrodes 114' may be provided to improve reflection visibility of external light EXL (shown in FIG. 8) for the plurality of GIP lines GPL. The plurality of dummy electrodes 114' may be provided to partially overlap at least one of the plurality of GIP lines GPL on an inorganic layer portion disposed in the non-display area NDA. The plurality of dummy electrodes 114' may be disposed on the flat portion 113 disposed on the GIP line GPL. The plurality of dummy electrodes 114' may be provided to be flat regardless of an uneven shape of the GIP line GPL. Therefore, the plurality of dummy electrodes 114' may be formed to be flat regardless of the uneven shape having the GIP line GPL. Therefore, the plurality of dummy electrodes 114' may reduce or prevent external light from being reflected by the plurality of GIP lines GPL. As a result, the plurality of dummy electrodes 114' may improve reflection visibility of the external light for the GIP line GPL. In addition, as at least a portion of the plurality of dummy electrodes 114' are disposed to be overlapped with each other on the plurality of gate driving circuits 200 (or GIP circuit), reflection visibility of the external light for the plurality of gate driving circuits 200 may be improved.

The plurality of dummy electrodes 114' may be provided in the non-display area NDA. The plurality of dummy electrodes 114' may be provided to be spaced apart from each other between the second transmissive portions TR2. Therefore, the plurality of dummy electrodes 114' may be provided in a structure similar to or the same as that of the first electrode 114 disposed to be spaced apart from each other in the pixel P. Therefore, the visibility difference between the non-display area NDA and the display area DA may be further reduced. Each of the plurality of dummy electrodes 114' may be disposed on the flat portion 113 (or an upper surface of the flat portion 113) overlaying the plurality of GIP lines GPL provided in the non-display area NDA. Therefore, the flat portion 113 of the non-display area NDA may be disposed below each of the dummy electrodes 114', and at least a portion of each of the dummy electrodes 114' may be disposed to be adjacent to at least one of the plurality of slit portions SLT or the plurality of second transmissive portions TR2.

Since each of the dummy electrodes 114' is disposed on the upper surface of the flat portion 113 overlaying the plurality of GIP lines GIP lines and the plurality of gate driving circuits 200, the dummy electrodes 114' may be provided to be flat. Therefore, reflection visibility for the external light may be more improved than the case that the dummy electrode is provided in the non-display area NDA to have an uneven structure. Since the dummy electrode provided in the uneven structure reflects the external light in various directions, reflection visibility may not be good. On the other hand, since the dummy electrode 114' provided in a flat structure like the present disclosure reflects most of the external light only in a certain direction, recognition of the GIP line GPL disposed below the dummy electrode 114' by a user may be reduced to improve reflection visibility.

The plurality of GIP lines GPL according to an example may include a plurality of first GIP lines GPL1 connecting pads of the pad area PA with the plurality of gate driving circuits 200 of the gate driver GD, and a plurality of second GIP lines GPL2 connecting the plurality of gate driving circuits 200 with the gate lines provided in the display area DA. Referring to FIG. 5, the plurality of first GIP lines GPL1 may be disposed in a vertical direction (or Y-axis direction of FIG. 3) between the second transmissive portions TR2, and the plurality of second GIP lines GPL2 may be disposed in a horizontal direction (or X-axis direction of FIG. 3) between the second transmissive portions TR2.

Referring back to FIG. 4, the organic light emitting layer 116 is formed on the first electrode 114 and the bank 115. When a voltage is applied to the first electrode 114 and the second electrode 117, holes and electrons move to the organic light emitting layer 116, respectively, and are combined with each other in the organic light emitting layer 116 to emit light.

The organic light emitting layer 116 may be formed of a plurality of subpixels SP and a common layer provided on the bank 115. In this case, the organic light emitting layer 116 may be provided in a tandem structure in which a plurality of light emitting layers, for example, a yellow-green light emitting layer and a blue light emitting layer are stacked, and may emit white light when an electric field is formed between the first electrode 114 and the second electrode 117.

A color filter (not shown) suitable for a color of a corresponding subpixel SP may be formed over the second substrate 120. For example, a red color filter may be provided in a red subpixel, a green color filter may be provided in a green subpixel, and a blue color filter may be provided in a blue subpixel. A white subpixel may not include a color filter because the organic light emitting layer 116 emits white light.

The second electrode 117 is formed on the organic light emitting layer 116. The second electrode 117 may be a common layer commonly formed in the subpixels SP. The second electrode 117 may be made of a transparent metal material, a semi-transmissive metal material or a metal material having high reflectance.

When the transparent display apparatus 100 is provided in a top emission mode, the second electrode 117 may be formed of a transparent conductive material (TCO) such as ITO and IZO, which may transmit light, or a semi-transmissive conductive material such as magnesium (Mg), silver (Ag) or an alloy of magnesium (Mg) and silver (Ag).

When the transparent display apparatus 100 is provided in a bottom emission mode, the second electrode 117 may be formed of a metal material having high reflectance, such as a stacked structure (Ti/Al/Ti) of aluminum and titanium, a stacked structure (ITO/Al/ITO) of aluminum and ITO, an Ag alloy and a stacked structure (ITO/Ag alloy/ITO) of Ag alloy and ITO. The Ag alloy may be an alloy of silver (Ag), palladium (Pd), copper (Cu), etc. The second electrode 117 may be a cathode electrode.

The capping layer 118 may be formed on the second electrode 117 but may be omitted.

The encapsulation layer 119 is formed on the capping layer 118. The encapsulation layer 119 serves to prevent oxygen or water from being permeated into the organic light emitting layer 116 and the second electrode 117. To this end, the encapsulation layer 119 may include at least one inorganic layer.

In the display apparatus 100 according to one embodiment of the present disclosure, the encapsulation layer 119 may be disposed in the non-display area NDA as well as the display area DA as shown in FIG. 6. The encapsulation layer 119 according to an example may be disposed between a transparent filling member TF (shown in FIG. 4) and the capping layer 118 in the display area DA, and may be disposed between the capping layer 118 and a transparent connection member TD (shown in FIG. 6) and between the buffer layer BL and the transparent connection member TD in the non-display area NDA. Therefore, a portion of the encapsulation layer 119 may overlap the first transmissive portion TR1 in the display area DA, and may overlap the plurality of slit portions SLT in the non-display area NDA.

The transparent connection member TD according to an example is for bonding the first substrate 110 and the second substrate 120 to each other. For example, the transparent connection member TD may include a thermosetting transparent adhesive or a light curable transparent adhesive. The transparent connection member TD may contain an absorbing material (not shown) for absorbing external water or moisture that is permeated into the display area DA. For example, the absorbing material may be a getter.

The transparent filling member TF according to an example may be disposed in the display area DA to adjoin the transparent connection member TD. The transparent filling member TF is disposed to fill a gap between the first substrate 110 and the second substrate 120, which are disposed in the display area DA, thereby supporting the first substrate 110 and the second substrate 120. Therefore, the transparent filling member TF may prevent the first substrate 110 and the second substrate 120, which are disposed in the display area DA, from being easily deformed by an external force. Also, the transparent filling member TF is provided to be disposed between the second substrate 120 and the organic light emitting layer 116 formed over the first substrate 110, thereby having a barrier function for blocking water so that external water or moisture permeated through the second substrate 120 does not reach the organic light emitting layer 116. The transparent fill member TF may further contain an absorbing material for absorbing water or moisture to enhance a water permeation prevention effect.

As shown in FIG. 6, the encapsulation layer 119 may be in contact with the transparent filling member TF in the display area DA, and may be in contact with the transparent connection member TD in the non-display area NDA. Therefore, the encapsulation layer 119 according to an example may be made of a material having a large adhesive force to at least one of the transparent filling member TF or the transparent connection member TD in order to increase an overall coupling force between the first substrate 110 and the second substrate 120.

As a result, the transparent display apparatus 100 according to one embodiment of the present disclosure may have a structural characteristic that includes a plurality of slit portions SLT overlapped with the transparent connection member TD in the non-display area NDA, and a first transmissive portion TR1 overlapped with the transparent filling member TF in the display area DA.

Referring back to FIG. 5, the second transmissive portion TR2 may include at least one concave portion CP and at least one convex portion PP. The concave portion CP and the convex portion PP are intended to reduce or prevent haze of a background or image that has transmitted the second transmissive portion TR2 when the background or image positioned on the front or rear surface of the display panel DP transmits the second transmissive portion TR2 and is visible to a user located in the direction of an opposite side of the display panel DP.

The concave portion CP and the convex portion may be disposed to be adjacent to each other. The concave portion CP may be formed in a semicircular shape as shown in FIG. 5, but is not limited thereto. The concave portion CP may be formed in various shapes such as '⊏' (e.g., an open rectangular shape, a "U" shape, whether vertical or horizontal), '<' (e.g., an open triangular shape), '⊂' (e.g., an open ovular or "C" shape), or rotated shapes of '⊏', '<' and '⊂' if haze may be reduced. The convex portion PP may be formed in a shape that is opposite to that of the concave portion CP, but is not limited thereto. The convex portion PP may be formed in various shapes.

Referring to FIGS. 5 and 6, in the transparent display apparatus 100 according to one embodiment of the present disclosure, each of the plurality of slit portions SLT may be disposed to connect the plurality of second transmissive portions TR2 adjacent to each other.

The second transmissive portion TR2 according to an example may be formed by patterning the inorganic layer portion (or circuit element layer) 111 made of a plurality of inorganic layers provided over the first substrate 110, the flat portion 113 provided over the inorganic layer portion 111, and the bank 115 disposed on the flat portion 113. As shown in FIG. 6, the plurality of slit portions SLT may be formed by patterning the inorganic layer portion 111 provided over the first substrate 110, the flat portion 113 provided over the inorganic layer portion 111, and the bank 115 provided on the flat portion 113, as shown in FIG. 6. Therefore, the plurality of slit portions SLT may be provided in a structure similar to that of the second transmissive portion TR2, and each of the plurality of slit portions SLT may be provided in a structure for connecting the plurality of second transmissive portions TR2 adjacent to each other on a plane as shown in FIG. 5. As shown in FIG. 5, the plurality of slit portions SLT may be provided to connect some of the second transmissive portions TR2 in another direction not a moisture-permeable direction, without connecting all of the second transmissive portions TR2. This will be described later in detail.

As described above, the plurality of second transmissive portions TR2 and the plurality of slit portions SLT may be formed by removing (or patterning) the flat portion 113 provided in the non-display area NDA, and may be connected to each other as shown in FIG. 5. Therefore, the transparent display apparatus 100 according to one embodiment of the present disclosure may prevent external water from being permeated into the display area DA through the flat portion 113 provided in the non-display area NDA as compared with the case that the flat portion of the non-display area NDA is not removed or disconnected.

As shown in FIG. 5, since the plurality of GIP lines GPL of the transparent display apparatus 100 according to one embodiment of the present disclosure do not pass the second transmissive portion TR2, i.e., do not overlap the second transmissive portion TR2, only the slit portion SLT may overlap at least one of the plurality of GIP lines GPL. Since each of the plurality of slit portions SLT is formed between the second transmissive portions TR2 adjacent to each other to have a width narrower than that of the second transmissive portion TR2, each of the plurality of slit portions SLT may overlap only a portion of the GIP lines GPL not all the GIP lines. Therefore, as shown in FIG. 5, the GIP lines GPL, which are not overlapped with each of the plurality of slit portions SLT, may overlap most of the plurality of dummy electrodes 114'.

A width W1 of each of the plurality of slit portions SLT may be narrower than a width W2 of each of the plurality of second transmissive portions TR2. Since each of the plurality of slit portions SLT is disposed between the plurality of dummy electrodes 114' disposed between the second transmissive portions TR2, when the width of each of the plurality of slit portions SLT is greater than or equal to the width of the second transmissive portion TR2, a size of the dummy electrode 114' may be relatively small. As a result, an area in which the GIP line GPL disposed below the dummy electrode 114' and the dummy electrode 114' overlap each other becomes smaller (or an area of the GIP line GPL exposed from the slit portion SLT becomes large), whereby reflectance of the GIP line GPL with respect to the external light may be increased. In this case, the user located in front of the display panel DP cannot view the background or image positioned on the rear surface of the display panel DP. That is, visibility is reduced. Therefore, in the transparent display apparatus 100 according to one embodiment of the present disclosure, as the width W1 of each of the plurality of slit portions SLT is narrower than the width W2 of each of the plurality of second transmissive portions TR2, an area in which each of the plurality of dummy electrodes 114' overlaps the GIP line GPL rather than each of the plurality of slit portions SLT may be increased, whereby reflection visibility of the GIP line GPL with respect to the external light may be improved.

Meanwhile, as the non-display area NDA is provided in the same structure as that of the display area DA, the visibility difference between the non-display area NDA and the display area DA may be gradually reduced. Therefore, in the transparent display apparatus 100 according to one embodiment of the present disclosure, the organic light emitting layer 116 provided in the display area DA may be provided even in the non-display area NDA so that the visibility difference between the display area DA and the non-display area NDA may be further reduced.

In more detail, as shown in FIG. 6, the organic light emitting layer 116 may be disposed to be extended to the non-display area NDA in which the plurality of slit portions SLT are disposed. However, when the organic light emitting layer 116 is provided in a single connected shape without being disconnected between the display area DA and the non-display area NDA, external water or moisture may be permeated into the display area DA through the organic light emitting layer 116 disposed to be adjacent to the outside (or disposed in the non-display area NDA), whereby the organic light emitting layer 116 disposed in the display area DA may be damaged.

Therefore, in the transparent display apparatus 100 according to one embodiment of the present disclosure, as the organic light emitting layer 116 is provided to be disconnected (or discontinuous) from each of the plurality of slit portions SLT as shown in FIG. 6, external water or moisture may be prevented from being permeated into the display area DA through the organic light emitting layer 116, whereby moisture permeation prevention may be increased or maximized.

As shown in FIG. 6, the organic light emitting layer 116 disposed in the non-display area NDA may be disconnected (or discontinuous) from the edge of each of the plurality of slit portions SLT. In order to disconnect the organic light emitting layer 116 from the edge of the slit portion SLT, the transparent display apparatus 100 according to one embodiment of the present disclosure may further include an undercut portion UC.

The undercut portion UC may be disposed between the first substrate 110 and the flat portion 113 (or between the buffer layer BL overlaying the plurality of GIP lines GPL and the flat portion 113). The undercut portion UC according to an example may be formed by removing at least a portion of the inorganic layer portion disposed in the slit portion SLT (or gate driver GD). For example, the undercut portion UC may be formed by removing the gate insulating layer 111*a*, the interlayer insulating layer 111*b* and the protective layer 111*c*, which are disposed between the buffer layer BL and the flat portion 113, from the slit portion SLT (or gate driver GD). After the dummy electrode 114' and the bank 115 are formed on the flat portion 113, the bank 115 and the flat portion 113, which are disposed in the slit portion SLT, are primarily removed through an exposure process and a dry etching process using a photoresist and a mask, and then the inorganic layers disposed in the slit portion SLT, that is, the gate insulating layer 111*a*, the interlayer insulating layer 111*b* and the protective layer 111*c* may be secondarily removed by a high concentration etchant. For example, the high concentration etchant may be a material capable of etching an inorganic layer such as $SiO_2$, and for example, may be a solution in which a neutral ammonium fluoride ($NH_4F$) and a buffered oxide etch (BOE) solution are mixed at a ratio of 6:1. The high concentration etchant may be in contact with the inorganic layers disposed in the slit portion SLT for about 20 seconds to 50 seconds, preferably 40 seconds, whereby at least some of the inorganic layers disposed in the slit portion SLT may be removed. Through the above-described process, the undercut portion UC having a predetermined or selected width UCW and a height UCH may be formed below the flat portion 113 of the non-display area NDA. In a subsequent process, the organic light emitting layer 116 formed entirely on the display area DA and the non-display area NDA may be disconnected (or discontinuous) from the undercut portion UC of the non-display area NDA, which has a predetermined or selected width UCW and a height UCH.

The width UCW of the undercut portion UC may be 0.1 μm to 5 μm. In this case, as shown in FIG. 6, the width UCW of the undercut portion UC may mean the shortest distance between the end of the flat portion 113 and the end of the protective layer 111*c* exposed by the high concentration etchant, which are closest to each other with the slit portion SLT interposed therebetween.

When the width UCW of the undercut portion UC is less than 0.1 μm, the organic light emitting layer 116 may not be disconnected, and when the width UCW of the undercut portion UC exceeds 5 μm, the encapsulation layer 119 may be disconnected without overlaying the undercut portion UC. When the encapsulation layer 119 is disconnected (or discontinuous), at least one of the organic light emitting layer 116 or the flat portion 113 may be exposed through the disconnected gap, and water may be permeated through the exposed organic light emitting layer 116 and flat portion 113, whereby reliability may be deteriorated.

The height UCH of the undercut portion UC may be 0.3 μm to 1.3 μm. In this case, the height UCH of the undercut portion UC may mean the shortest distance between the end of the flat portion 113 and the upper surface of the buffer layer BL exposed by the high concentration etchant, which are closest to each other with the slit portion SLT interposed therebetween. In FIG. 6, since the protective layer 111*c*, the interlayer insulating layer 111*b* and the gate insulating layer 111*a* are removed by the high concentration etchant, the upper surface of the buffer layer BL may be a reference point of the height UCH of the undercut portion UC. However, when the protective layer 111*c* and the interlayer insulating layer 111*b* are only removed by the high concentration etchant, the reference point of the height UCH of the undercut portion UC may be an upper surface of the gate insulating layer 111*a*.

When the height UCH of the undercut portion UC is less than 0.3 μm, the organic light emitting layer 116 may not be disconnected, and when the height UCH of the undercut portion UC exceeds 1.3 μm, the buffer layer BL that covers the GIP line GPL below the slit portion SLT may be removed by the high concentration etchant. Therefore, the GIP line GPL may be exposed without being covered by the buffer layer BL, and thus may be damaged by the high concentration etchant. As can be seen, the light emitting layer 116 and the capping layer 118 can be positioned in the slit area SLT2 under the encapsulation layer 119 while the conductive layers 114' and 118 are discontinuous, namely, they terminate before reaching the slit area SLT2.

The organic light emitting layer 116 may have segments (e.g., three segments shown in FIG. 6) that are disconnected from each other by the undercut portion UC. The inorganic layers may have segments (e.g., three segments shown in FIG. 6) that are disconnected from each other by the undercut portion UC.

Therefore, in the transparent display apparatus 100 according to one embodiment of the present disclosure, as the width UCW of the undercut portion UC is 0.1 μm to 5 μm, and the height UCH of the undercut portion UC is 0.3 μm to 1.3 μm, the organic light emitting layer 116 is disconnected (or discontinuous) but the encapsulation layer 119 is not disconnected, but remains continuous and the GIP portion line GPL below the slit portion SLT may be prevented from being exposed to the high concentration etchant. Therefore, in the transparent display apparatus 100 according to one embodiment of the present disclosure, moisture permeation through the organic light emitting layer 116 disposed in the non-display area NDA may be avoided or reduced and thus reliability may be improved. The GIP line GPL below the slit portion SLT may be prevented from being damaged by the high concentration etchant, and thus durability may be improved.

The height UCH of the undercut portion UC is limited to 0.3 μm or more, but is not necessarily limited thereto. The height UCH of the undercut portion UC may be less than 0.3 μm and thicker (or higher) than the thickness of the organic light emitting layer 116 if the organic light emitting layer 116 may become disconnected.

As shown in FIGS. 5 and 6, the undercut portion UC may be disposed along the edge of the slit portion SLT below the flat portion 113. As the organic light emitting layer 116 is formed in a subsequent process after the undercut portion UC is formed, the organic light emitting layer 116 may be disconnected, namely discontinuous, from the undercut portion UC, and a portion of the organic light emitting layer 116 may be disposed in the slit portion SLT positioned between the undercut portions UC. Also, the capping layer 118 formed after the organic light emitting layer 116 may be disconnected from the undercut portion UC like the organic light emitting layer 116, and a portion of the capping layer 118 may be disposed in the slit portion SLT positioned between the undercut portions UC. Therefore, as shown in FIG. 6, the disconnected organic light emitting layer 116 and the capping layer 118 disconnected on the disconnected organic light emitting layer 116 may be disposed in each of the plurality of slit portions SLT.

Although not shown, in the transparent display apparatus 100 according to one embodiment of the present disclosure, the second electrode 117 formed between the organic light emitting layer 116 and the capping layer 118 in the display area DA may also be formed in the non-display area NDA. In this case, since the non-display area NDA is similar to the structure of the display area DA, the visibility difference between the non-display area NDA and the display area DA may be further reduced. The second electrode 117 disposed in the non-display area NDA may be disconnected from the undercut portion UC like the organic light emitting layer 116 of FIG. 6, but may not be disconnected from the undercut portion UC unlike the organic light emitting layer 116.

When the second electrode 117 disposed in the non-display area NDA is not disconnected from the undercut portion UC, since the second electrode 117 disposed in the non-display area NDA is disposed to be adjacent to or latterly surround the flat portion 113 together with the encapsulation layer 119, the transparent display apparatus 100 according to one embodiment of the present disclosure may further improve the moisture permeation prevention effect through the flat portion 113.

Meanwhile, in the transparent display apparatus 100 according to one embodiment of the present disclosure, in order to reduce the visibility difference between the display area DA and the non-display area NDA, the dummy electrode 114' comprised of the same layer as the first electrode 114 may be provided even in the non-display area NDA. However, since the dummy electrode 114' provided in the non-display area NDA is provided to reduce the visibility difference, the dummy electrode 114' may be formed to be patterned in the form of many individual islands as shown in FIG. 5 without an electrical function and without power supply being provided to them. Therefore, the dummy electrode 114' provided in the non-display area NDA may be a patterned electrode having no electrical function. In particular, the dummy electrode 114' is electrically isolated from all power sources and thus has not current or voltage present in the structure. Since a power source is not supplied to the dummy electrode 114' disposed below the second electrode of the non-display area NDA even though the second electrode disposed in the non-display area is not disconnected, the organic light emitting layer 116 disposed in the non-display area NDA may not emit light.

The dummy electrode (or pattern electrode) 114' provided in the non-display area NDA may vary in shape depending on the shape of the second transmissive portion TR2. In FIG. 5, each of the plurality of dummy electrodes 114' is formed in a rectangular shape by way of example, the dummy electrode (or pattern electrode) 114' may be formed in a jar shape having a convex protrusion. In this case, an overlap area of the dummy electrode (or pattern electrode) 114' with the GIP lines GPL disposed between the second transmissive portions TR2 may be increased, whereby reflection visibility for the external light may be further improved.

The dummy electrode 114' according to an example may be disposed on the flat portion 113 that covers the GIP line GPL of the gate driver GD. As described above, in the transparent display apparatus 100 according to one embodiment of the present disclosure, since the organic light emitting layer 116 is provided even in the non-display area NDA, the dummy electrode 114' may be formed before the organic light emitting layer 116 in the process order. Therefore, the dummy electrode 114' may be disposed between the flat portion 113 of the non-display area NDA and the organic light emitting layer 116 of the non-display area NDA. In more detail, since the flat portion 113, the dummy electrode 114' and the organic light emitting layer 116, which are disposed in the non-display area NDA, may be formed together with the flat portion 113, the first electrode 114 and the organic light emitting layer 116, which are disposed in the display area DA, the dummy electrode 114' of the non-display area NDA may be positioned between the flat portion 113 and the organic light emitting layer 116 like the first electrode 114 of the display area DA.

Therefore, as shown in FIGS. 4 and 6, in the transparent display apparatus 100 according to one embodiment of the present disclosure, since a cross-sectional structure of the subpixel SP in the display area DA and a cross-sectional structure (or sectional structure in which the dummy electrode 114' is provided) disposed between the second transmissive portions TR2 and the slit portions SLT in the non-display area NDA are similar to each other, the visibility difference between the display area DA and the non-display area NDA may be reduced, whereby a user may view a background or image in the direction of the rear surface of the display panel DP integrally.

Referring back to FIG. 5, each of the plurality of second transmissive portions TR2 may be connected to at least one slit portion SLT. For example, the slit portion SLT may be connected to each of the upper, right and lower sides of the second transmissive portion TR2 disposed at the center in FIG. 5. That is, the second transmissive portion TR2 disposed at the center in FIG. 5 may be connected to three slit portions SLT. Therefore, the second transmissive portion TR2 disposed at the center and the slit portion SLT disposed at the upper and lower sides of the second transmissive portion TR2 may block water permeated in the first direction (arrow direction D1). Further, the slit portion SLT disposed at the center and the slit portion SLT disposed at the right side of the second transmissive portion TR2 may block water that is permeated in the second direction (arrow direction D2). In this case, the first direction (arrow direction D1) may be a direction toward the display area DA from the outside of the display panel DP. That is, the first direction (arrow direction D) may be a moisture-permeable direction in which external water is permeated from the non-display area NDA to the display area DA. The second direction (arrow direction D2) may be in a direction crossing the first direction (arrow direction D1).

For example, based on the non-display area NDA adjacent to the left side of the display area DA in FIG. 3, the first direction (arrow direction D1) may be a direction parallel with the X-axis direction (or horizontal length direction of the first substrate 110), and in this case, the second direction (arrow direction D2) may be a direction parallel with the Y-axis direction (or vertical length direction of the first substrate 110). Based on the non-display area NDA adjacent to the lower side of the display area DA, the first direction (arrow direction D1) may be a direction parallel with the Y-axis direction (or vertical length direction of the first substrate 110), and in this case, the second direction (arrow direction D2) may be a direction parallel with the X-axis direction (or horizontal length direction of the first substrate 110). As a result, since the first direction (arrow direction D1) may be a direction that may pass through the display area DA from the non-display area NDA at the shortest distance, the first direction may be a direction in which moisture permeation is made wall. The second direction (arrow direction D2) may be a direction in which a moisture permeation path becomes longer than that of the first direction (arrow direction D1).

In the transparent display apparatus 100 according to one embodiment of the present disclosure, more slit portions SLT are provided to be disposed in the first direction (arrow direction D1) in which moisture permeation is made relatively better than in the second direction (arrow direction D2), whereby moisture permeation for the display area DA may be avoided or reduced more effectively.

The second transmissive portion TR2 is connected to the three slit portions SLT, but is not limited thereto, and four or more slit portions SLT may be connected to the second transmissive portion TR2 in different directions to increased or maximize the moisture permeation prevention effect.

Meanwhile, in the transparent display apparatus 100 according to one embodiment of the present disclosure, the plurality of slit portions SLT may include a plurality of first slit portions SLT1 and a plurality of second slit portions SLT2.

The plurality of first slit portions SLT1 according to an example may be disposed to be elongated in the first direction (or arrow direction D1). That is, the first slit portions SLT1 may be disposed in parallel with the first direction (or moisture-permeable direction) (arrow direction D1).

The plurality of second slit portions SLT2 according to an example may be disposed to be elongated in the second direction D2 in the second direction (arrow direction D2). That is, the second slit portions SLT2 may be disposed in a direction crossing the first slit portion SLT1. Therefore, the second slit portion SLT2 may more prevent (or block) moisture permeation in the first direction (arrow direction D1) than the first slit portion SLT1.

Referring to FIG. 5, in the transparent display apparatus 100 according to one embodiment of the present disclosure, the plurality of second slit portions SLT2 disposed in a direction crossing the first direction (arrow direction D1) are provided to be connected to each of the plurality of second transmissive portions TR2 disposed in the first direction (arrow direction D1), whereby external water may be effectively prevented from being permeated in the first direction (arrow direction D1) between the second transmissive portions TR2.

Therefore, as shown in FIG. 5, the transparent display apparatus 100 according to one embodiment of the present disclosure may have a structural characteristic in which at least a portion of each of the plurality of second slit portions SLT2 is disposed to overlap each other in the first direction (arrow direction D1).

On the other hand, the plurality of first slit portions SLT1 may be disposed only in odd-numbered second transmissive portions TR2 or even-numbered second transmissive portions TR2 of the plurality of second transmissive portions TR2 disposed in the second direction (arrow direction D2).

For example, in FIG. 5, the plurality of first slit portions SLT1 disposed in the second direction D2 may be disposed to be connected to the first and third transmissive portions TR2 and TR2 based on a first column, and may be disposed to be connected to the second transmissive portion TR2 based on a second column. Therefore, as shown in FIG. 5, the transparent display apparatus 100 according to one embodiment of the present disclosure may have a structural characteristic in which the plurality of first slit portions SLT1 are disposed in a zigzag shape in the second direction (arrow direction D2).

Meanwhile, the plurality of first slit portions SLT1 are alternately disposed in the odd-numbered or even-numbered second transmissive portions TR2 in a zigzag shape without being disposed in all the second transmissive portions TR2 like the second slit portions SLT2. This is because that the dummy electrode 114' made of the same material as that of the first electrode 114 may be exposed from the slit portion SLT to generate diffused reflection of the external light when a misalignment occurs in an exposure mask or a pattern mask of the dummy electrode 114'.

Therefore, in the transparent display apparatus 100 according to one embodiment of the present disclosure, as the first slit portions SLT1 disposed in a direction in which moisture permeation is not relatively well made are disposed alternately (or in a zigzag shape), the number of the first slit portions SLT1 in which misalignment occurs may be minimized even though misalignment occurs when the first slit portion SLT1 is formed, whereby diffused reflection of the external light may be reduced.

Referring to FIG. 5, since the first slit portion SLT1 is disposed in the first direction (arrow direction D1) crossing the first GIP line GPL1, the organic light emitting layer 116 and the capping layer 118 may be disposed over the buffer layer BL overlaying the plurality of first GIP lines GPL1 in the cross-sectional structure as shown in FIG. 7, and the encapsulation layer 119 may be disposed thereon. Therefore, the transparent display apparatus 100 according to one embodiment of the present disclosure is provided such that the flat portion 113 is not disposed over the first slit portion SLT1, moisture permeation through the flat portion 113 may be avoided or reduced in the non-display area NDA.

In addition, the flat portion 113 may not be disposed over the second slit portion SLT2. As described above, the second slit portion SLT2 may be disposed in the second direction (arrow direction D2) crossing the second GIP line GPL2. Therefore, in the transparent display apparatus 100 according to one embodiment of the present disclosure, since the flat portion 113 of the non-display area NDA may be disconnected through the plurality of first slit portions SLT1 and the plurality of second slit portions SLT2, moisture permeation in the first direction (arrow direction D1) and the second direction (arrow direction D2) may be reduced and/or avoided or the moisture permeation path may be lengthened, whereby reliability may be improved.

Figure 8:
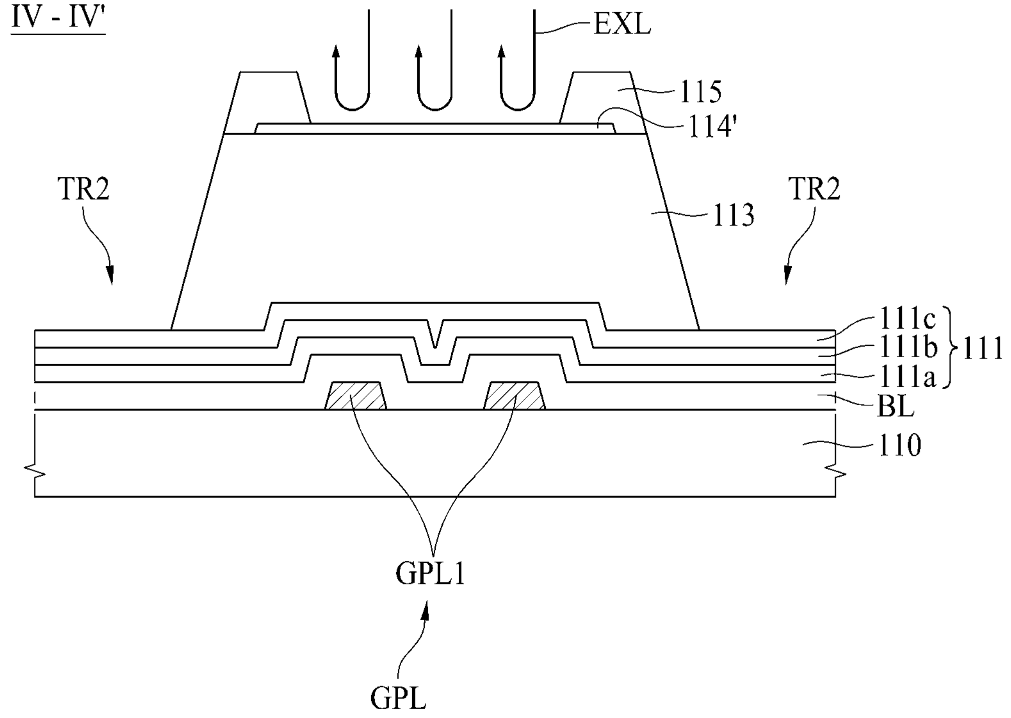
FIG. 8 is a schematic cross-sectional view taken along line IV-IV' shown in FIG. 5.

FIG. 8 is a schematic cross-sectional view taken along line IV-IV' shown in FIG. 5.

Referring to FIG. 8, in the transparent display apparatus 100 according to one embodiment of the present disclosure, the gate driver GD may include an inorganic layer portion 111 made of a plurality of inorganic layers overlaying a plurality of GIP lines GPL, a flat portion 113 disposed on an upper surface of the inorganic layer portion 111, a dummy electrode 114' disposed on an upper surface of the flat portion 113, and a bank 115 covering an edge of the dummy electrode 114'. Therefore, a portion of the bank 115 may be disposed on the upper surface of the flat portion 113 together with the dummy electrode 114'. The inorganic layer portion 111 may include a gate insulating layer 111*a* disposed on an upper surface of the buffer layer BL, an interlayer insulating layer 111*b* disposed on an upper surface of the gate insulating layer 111*a*, and a protective layer 111*c* disposed on an upper surface of the interlayer insulating layer 111*b*.

As shown in FIG. 8, the inorganic layer portion 111 may be disposed on the upper surface of the buffer layer BL overlaying the plurality of GIP lines GPL. The flat portion 113 may be formed over the inorganic layer portion 111 to be thicker than the inorganic layer portion 111. For this reason, the dummy electrode 114' disposed on the upper surface of the flat portion 113 may be provided to be flat. Therefore, the dummy electrode 114' (or dummy electrode 114' provided to be flat), which is not covered by the bank 115, may reflect the external light EXL in a predetermined or selected direction as compared with the dummy electrode that is not flat, thereby reducing diffused reflection of the external light EXL. Further, as shown in FIG. 8, since the dummy electrode 114' may be wider than the plurality of GIP lines GPL, so that at least a portion of the dummy electrode 114' may overlap the plurality of GIP lines GPL, recognition of the shape of the plurality of GIP lines GPL by a user may be reduced.

Meanwhile, if there is no flat portion 113 between the dummy electrode 114' and the GIP line GPL, a high parasitic capacitance may occur because a distance between the dummy electrode 114' and the GIP line GPL is short. As the parasitic capacitance is increased, abnormal GIP output and signal delay may be generated. Therefore, in the transparent display apparatus 100 according to one embodiment of the present disclosure, the flat portion 113 is disposed between the GIP line GPL and the dummy electrode 114' of the non-display area NDA, whereby the distance between the dummy electrode 114' and the GIP line GPL may be farther away than the case that there is no flat portion 113. Therefore, in the transparent display apparatus 100 according to one embodiment of the present disclosure, the parasitic capacitance between the dummy electrode 114' and the GIP line GPL may be mitigated, whereby abnormal GIP output may be prevented from being generated, and signal delay may be avoided.

Figure 9:
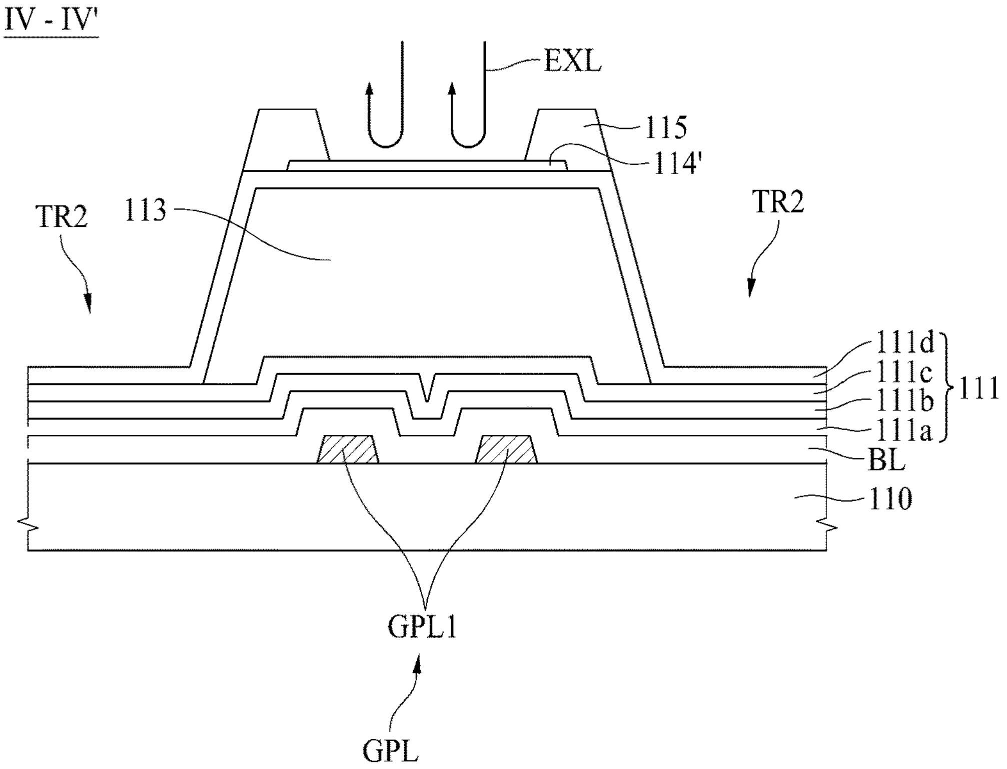
FIG. 9 is another schematic cross-sectional view taken along line IV-IV' shown in FIG. 5.

FIG. 9 is another schematic cross-sectional view taken along line IV-IV' shown in FIG. 5.

The transparent display apparatus 100 shown in FIG. 9 is the same as the transparent display apparatus 100 shown in FIG. 8, except that the structure of the inorganic layer portion 111 is changed. Therefore, the same reference numerals are given to the same elements, and different elements from those of FIG. 8 will be described.

In case of the transparent display apparatus shown in FIG. 8, the flat portion 113 is disposed between the inorganic layer portion 111 and the dummy electrode 114' to planarize the dummy electrode 114'. Therefore, in case of the transparent display apparatus shown in FIG. 8, reflection visibility of the external light is improved due to the dummy electrode 114' formed in a flat shape, whereby the shape of the GIP line GPL may not be recognized by the user.

In contrast, in case of the transparent display apparatus shown in FIG. 9, the protective layer of the inorganic layer portion 111 may include a first protective layer 111*c* and a second protective layer 111*d*. The first protective layer 111*c* may be disposed over the plurality of GIP lines GPL to overlay the plurality of GIP lines GPL. In more detail, the first protective layer 111*c* may be disposed between the interlayer insulating layer 111*b* and the flat portion 113. The second protective layer 111*d* may be disposed over the first protective layer 111*c* to overlay a side and an upper surface of the flat portion 113 disposed on the upper surface of the first protective layer 111*c*.

Therefore, as shown in FIG. 9, a portion of the bank 115 and the dummy electrode 114' may be disposed on the upper surface of the second protective layer 111*d* disposed on the upper surface of the flat portion 113. The second protective layer 111*d* may be in contact with the upper surface and the side of the flat portion 113 disposed below the dummy electrode 114', and may be in contact with the upper surface of the first protective layer 111*c* in the second transmissive portion TR2.

As a result, the transparent display apparatus 100 according to FIG. 9 is provided in a structure in which the second protective layer 111*d* and the first protective layer 111*c* overlays the upper surface, the side and the lower surface of the flat portion 113 disposed below the dummy electrode 114', whereby moisture permeation through the flat portion 113 disposed in the non-display area NDA may be further reduced.

Figure 10:
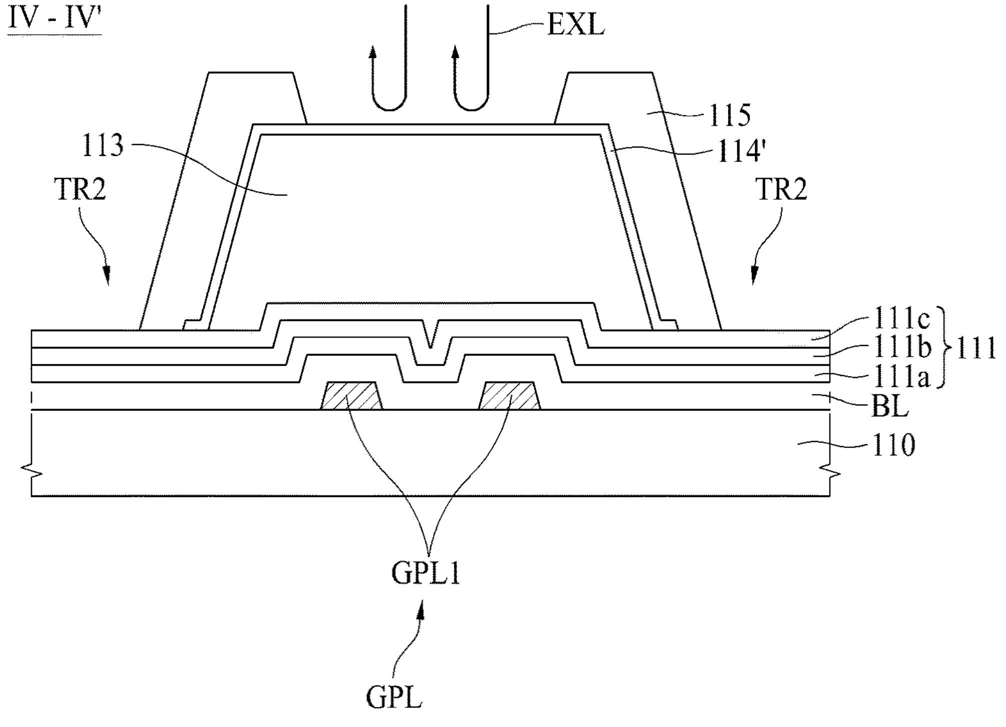
FIG. 10 is other schematic cross-sectional view taken along line IV-IV' shown in FIG. 5.

FIG. 10 is other schematic cross-sectional view taken along line IV-IV' shown in FIG. 5.

The transparent display apparatus 100 of FIG. 10 is the same as the transparent display apparatus 100 shown in FIG. 8 except that the structure of the dummy electrode 114' and the bank 115 is changed. Therefore, the same reference numerals are given to the same elements, and different elements from those of FIG. 8 will be described.

In case of the transparent display apparatus shown in FIG. 8, since the dummy electrode 114' is formed to have a smaller size (or narrow width) than the upper surface of the flat portion 113, a portion of the dummy electrode 114' and the bank 115 may be disposed on the upper surface of the flat portion 113.

In contrast, in case of the transparent display apparatus shown in FIG. 10, the dummy electrode 114' may be provided to be larger than a size (or width) of the flat portion 113, so that the dummy electrode 114' may be disposed on the upper surface and the side of the flat portion 113. In addition, a portion (or extension portion) of the edge of the dummy electrode 114' may be in contact with the protective layer 111*c*. For example, a portion (or extension portion) of the edge of the dummy electrode 114' may be in contact with the protective layer 111*c* on the lower surface of the bank 115 disposed on the side of the flat portion 113.

Therefore, the transparent display apparatus 100 according to FIG. 10 may be provided such that the dummy electrode 114' is in contact with the protective layer 111*c* to cover the upper surface and the side of the flat portion 113 and the protective layer 111*c* covers the lower surface of the flat portion 113, whereby moisture permeation through the flat portion 113 disposed in the non-display area NDA may be further reduced.

Meanwhile, in case of the transparent display apparatus 100 shown in FIG. 10, since a portion (or extension portion) of the edge of the dummy electrode 114' is in contact with the upper surface of the protective layer 111*c*, the bank 115 may be disposed from the upper surface of the flat portion 113 to the protective layer 111*c*, which is not in contact with the edge of the dummy electrode 114', to overlay the entire edge of the dummy electrode 114'. Therefore, in case of the transparent display apparatus 100 shown in FIG. 10, the bank 115 may be provided to have a width and a height, which are greater than those of the bank of the transparent display apparatus shown in FIG. 8. This bank 115 may be in contact with the protective layer 111*c* as well as the edge of the dummy electrode 114'.

In addition, the transparent display apparatus 100 shown in FIG. 10 is provided in a structure in which the dummy electrode 114' and the bank 115 doubly overlay and in some instances, surround the side of the flat portion 113 disposed in the non-display area NDA, whereby moisture permeation through the flat portion 113 of the non-display area NDA may be further reduced and/or minimized.

Figure 11:
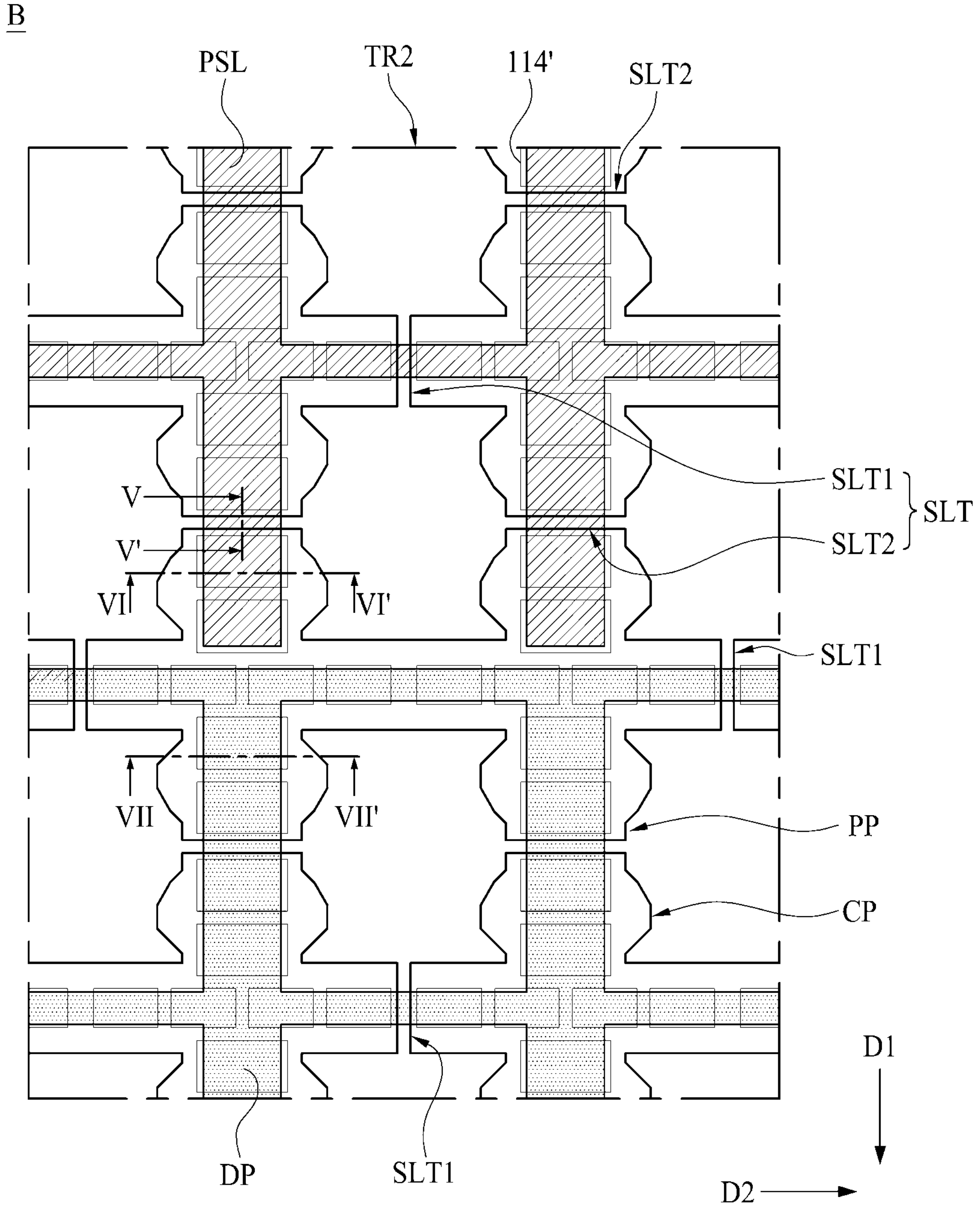
FIG. 11 is a schematic enlarged view illustrating a portion B of FIG. 3.
Figure 12:
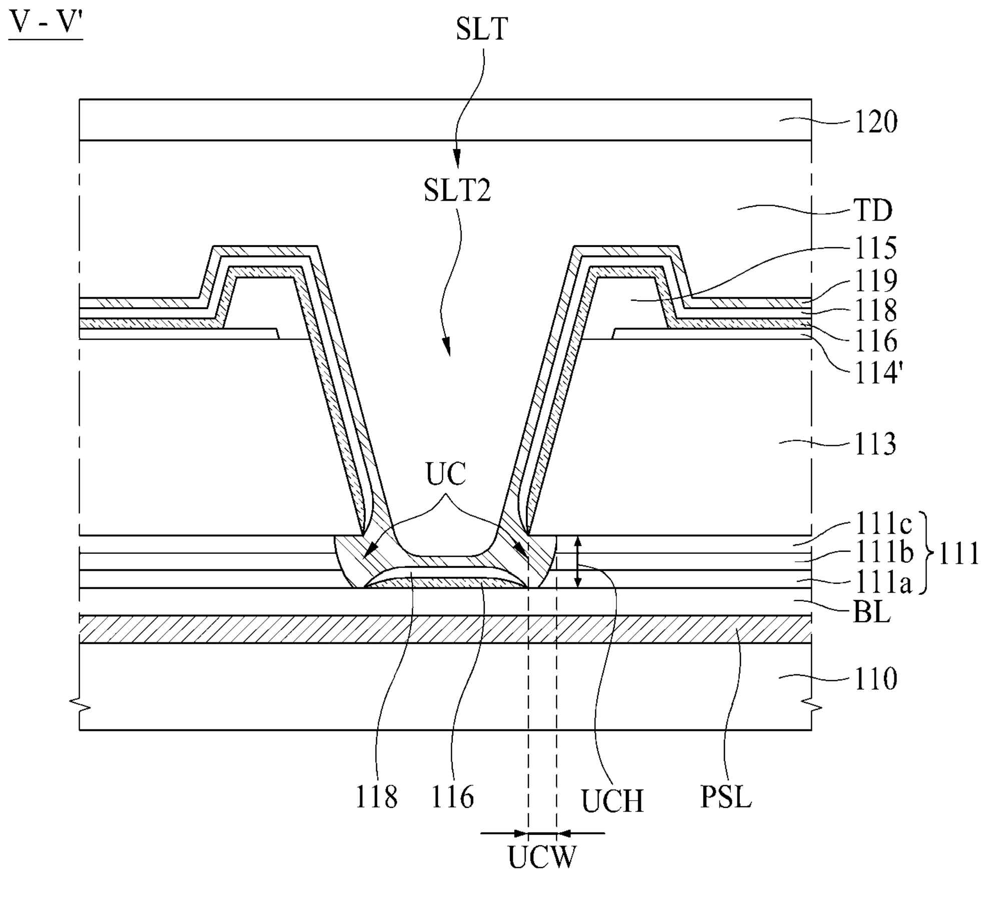
FIG. 12 is a schematic cross-sectional view taken along line V-V' shown in FIG. 11.
Figure 13:
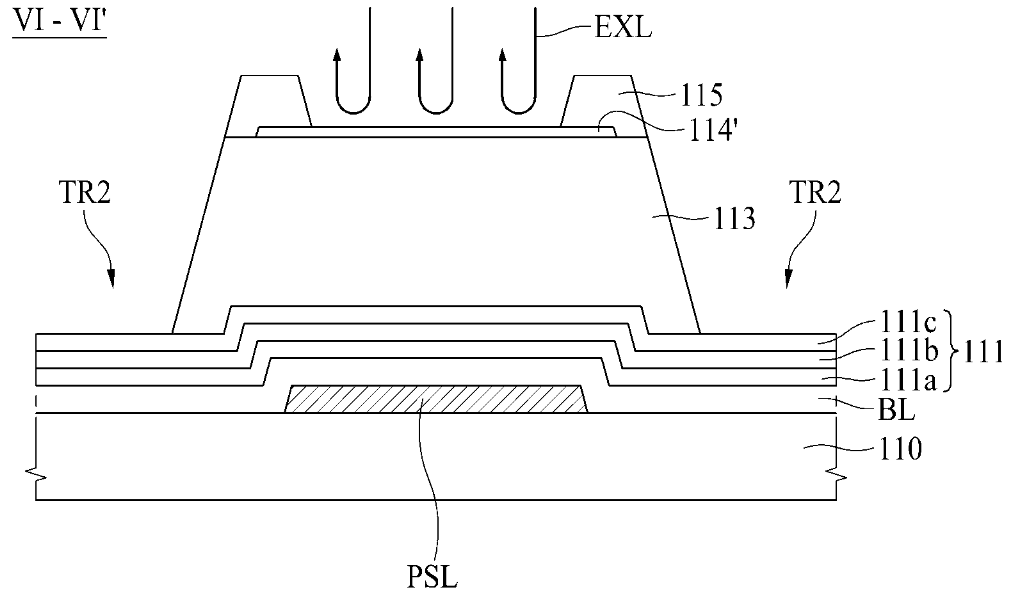
FIG. 13 is a schematic cross-sectional view taken along line VI-VI' shown in FIG. 11.
Figure 14:
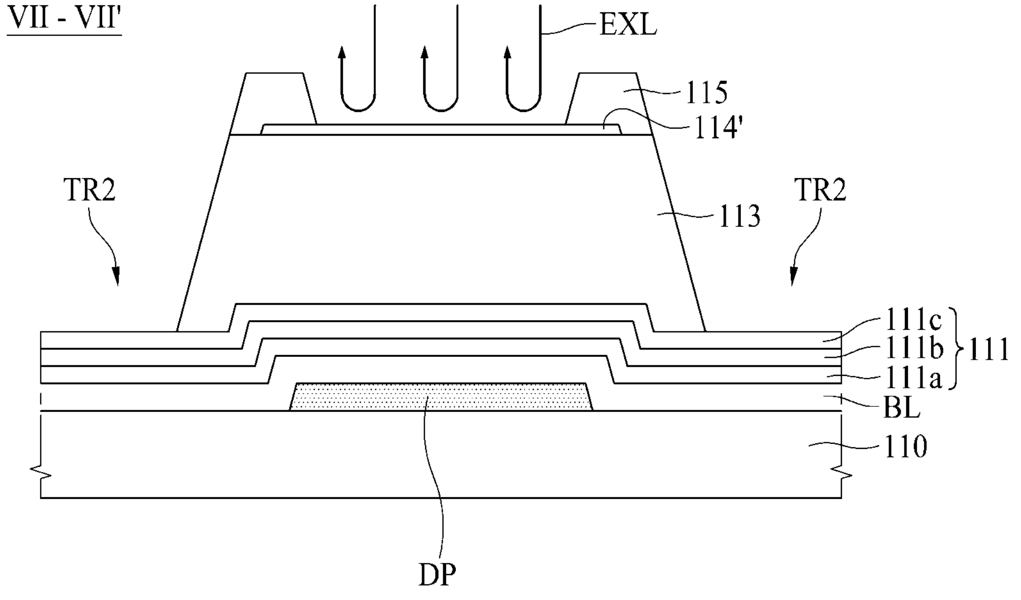
FIG. 14 is a schematic cross-sectional view taken along line VII-VII' shown in FIG. 11.

FIG. 11 is a schematic enlarged view illustrating a portion B of FIG. 3, FIG. 12 is a schematic cross-sectional view taken along line V-V' shown in FIG. 11, FIG. 13 is a schematic cross-sectional view taken along line VI-VI' shown in FIG. 11, and FIG. 14 is a schematic cross-sectional view taken along line VII-VII' shown in FIG. 11.

Referring to FIGS. 11 to 14, the transparent display apparatus 100 according to one embodiment of the present disclosure may further include a non-pad portion NP. The non-pad portion NP may be provided in the non-display area NDA except the pad area PA and the gate driver GD. Therefore, as shown in FIG. 3, the non-pad portion NP may be disposed to be adjacent to the lower side of the display area DA.

The non-pad portion NP may include a plurality of second transmissive portions TR2. Since the plurality of second transmissive portions TR2 disposed in the non-pad portion NP may be provided in the same structure as that of the plurality of second transmissive portions TR2 provided in the gate driver GD, their detailed description will be omitted.

The non-pad portion NP may further include a plurality of power lines PSL for supplying a power source to the display area DA, or a plurality of dummy patterns DP. However, the non-pad portion NP may include both a plurality of power lines PSL and a plurality of dummy patterns DP. Unlike the GIP line GPL of FIG. 5, each of the plurality of power lines PSL and the plurality of dummy patterns DP may be formed in a bar shape, but is not limited thereto.

The plurality of power lines PSL and the plurality of dummy patterns DP may be disposed between the plurality of second transmissive portions TR2. In this case, the plurality of power lines PSL may mean a power line PSL in a vertical direction and a power line PSL in a horizontal direction based on FIG. 11. Likewise, the plurality of dummy patterns DP may mean a dummy pattern DP in a vertical direction and a dummy pattern DP in a horizontal direction based on FIG. 11. As shown in FIG. 11, each of the plurality of power lines PSL and the plurality of dummy patterns DP may be provided in a mesh shape by being integrally formed.

The plurality of power lines PSL are for supplying the power source to the display area DA. The plurality of power lines PSL according to an example may be disposed in a mesh shape in the non-pad portion NP to supply the power source to each area of the display area DA, but are not limited thereto, and the plurality of power lines PSL may be divisionally disposed. The plurality of power lines PSL may include at least one of a power sharing line, a VDD shorting bar, a VSS shorting bar, a VDD power supply line or a VDD power supply line. Each of the power sharing line, the VDD shorting bar, the VSS shorting bar, the VDD power supply line and the VDD power supply line may be provided as at least one or more.

As shown in FIG. 12, the plurality of power lines PSL may be disposed between the first substrate 110 and the buffer layer BL, which are disposed in the non-display area NDA, but are not limited thereto. The plurality of power lines PSL may be provided between the buffer layer BL and the circuit element layer 111.

The plurality of dummy patterns DP may be formed in the non-display area NDA to reduce a visibility difference with a portion in which the plurality of power lines PSL are disposed. The plurality of dummy patterns DP according to an example may be formed in the same shape as that of the plurality of power lines PSL. For example, as shown in FIG. 11, the plurality of dummy patterns DP may be provided in a mesh shape. The plurality of dummy patterns DP may be disposed to be adjacent to the plurality of power lines PSL to have continuity. Therefore, a difference between a portion in which the plurality of dummy patterns DP are disposed and a portion in which the plurality of power lines PSL are disposed may be reduced. The plurality of dummy patterns DP may be disposed on the same layer as the plurality of power lines PSL, but are not limited thereto.

Referring back to FIG. 11, the non-pad portion NP may further include a slit portion SLT.

The slit portion SLT may be disposed to connect the plurality of second transmissive portions TR2 adjacent to each other. The slit portion SLT may be disposed between the plurality of dummy electrodes 114'. In addition, the slit portion SLT may include an undercut portion, and the undercut portion may be disposed along an edge of the slit portion SLT. Since the slit portion SLT disposed in the non-pad portion NP is the same as the slit portion SLT shown in FIG. 5, its detailed description will be omitted.

Referring to FIG. 11, the slit portion SLT may partially overlap the plurality of power lines PSL or the plurality of dummy patterns DP. In the gate driver GD of FIG. 5, the slit portion SLT is overlapped with at least one of the plurality of GIP lines GPL. In contrast, since the non-pad portion NP of FIG. 11 is provided with a plurality of power lines PSL or a plurality of dummy patterns DP without being provided with a gate driving circuit, etc., the slit portion SLT may partially overlap the plurality of power lines PSL or the plurality of dummy patterns DP. When the plurality of power lines PSL and the plurality of dummy patterns DP are all provided in the non-pad portion NP, the slit portion SLT may partially overlap each of the plurality of power lines PSL and the plurality of dummy patterns DP.

The non-pad portion NP of FIG. 11 may include a plurality of slit portions SLT that include a plurality of first slit portions SLT1 and a plurality of second slit portions SLT2.

The plurality of first slit portions SLT1 may be disposed to be elongated in the first direction (or moisture-permeable direction) (arrow direction D1). The plurality of second slit portions SLT2 may be disposed in a direction crossing the first slit portion SLT1. That is, the plurality of second slit portions SLT2 may be disposed to be elongated in the second direction (arrow direction D2).

Referring to FIGS. 5 and 11, in case of FIG. 5, since the gate driver GD is disposed in at least one of the left and right sides of the display area DA, the first direction (arrow direction D1) (moisture-permeable direction) may be a direction that is toward the right side from the left side or vice versa. However, in case of FIG. 11, since the non-pad portion NP is disposed on the lower side of the display area DA, the first direction (arrow direction D1) (or moisture-permeable direction) may be a direction that is toward the upper side from the lower side.

Therefore, as shown in FIG. 11, the plurality of second slit portions SLT2 according to an example may be disposed to be connected to each of the plurality of second transmissive portions TR2 in the first direction (arrow direction D1). Therefore, the plurality of second slit portions SLT2 may effectively prevent moisture permeation in the first direction (or moisture-permeable direction) (arrow direction D1) from occurring in the non-pad portion NP. In addition, as the plurality of second slit portions SLT2 are disposed to be connected to each of the plurality of second transmissive portions TR2 in the first direction (arrow direction D1), at least some of the plurality of second slit portions SLT2 may overlap each other in the first direction (or moisture-permeable direction) (arrow direction D1).

Meanwhile, the plurality of first slit portions SLT1 disposed in the non-pad portion NP may be disposed in a zigzag shape in the second direction (arrow direction D2). For example, the plurality of first slit portions SLT1 may be disposed to be connected to only odd-numbered second transmissive portions TR2 or even-numbered second transmissive portions TR2 of the plurality of second transmissive portions TR2 disposed in the second direction (arrow direction D2). Therefore, the first slit portions SLT1 may be provided in the non-pad portion NP in a smaller number than the second slit portions SLT2. Therefore, even though misalignment occurs when the plurality of first slit portions SLT1 are formed, since the number of the first slit portions SLT1 is smaller than that of the second slit portion SLT2, diffused reflection of the external light may be reduced.

Referring to FIG. 12, the flat portion 113 may be disposed over the plurality of power lines PSL disposed in the non-pad portion NP. The dummy electrode 114' may be disposed on the flat portion 113. The dummy electrodes 114' may be disposed to be spaced apart from each other as shown in FIG. 11. Therefore, each of the plurality of dummy electrodes 114' may be partially overlapped with the plurality of power lines PSL. Since the portion in which the plurality of dummy patterns DP are disposed may be also provided in the same or similar shape as or to that of the portion in which the plurality of power lines PSL are disposed, the plurality of dummy electrodes 114' may be partially overlapped with the plurality of dummy patterns DP.

As shown in FIG. 13, since the dummy electrode 114' is disposed on the flat portion 113, the dummy electrode 114' may be provided to be flat regardless of an uneven shape of the power line PSL. Further, the dummy electrode 114' may be wider than the power line PSL, so that at least a portion of the dummy electrode 114' may overlap the power line PSL in the thickness direction of the first substrate 110. Therefore, diffused reflection due to the uneven shape of the power line PSL may be improved or avoided. In addition, recognition of the shape of the power line PSL by the user may be reduced or the shape of the power line PSL may not be recognized by the user.

Likewise, as shown in FIG. 14, since the dummy electrode 114' is disposed on the flat portion 113, the dummy electrode 114' may be provided to be flat regardless of the uneven shape of the dummy pattern DP. The dummy electrode 114' may be wider than the dummy pattern DP, so that at least a portion of the dummy electrode 114' may overlap the dummy pattern DP in the thickness direction of the first substrate 110. Therefore, diffused reflection due to the uneven shape of the power line PSL may be improved or avoided. In addition, recognition of the shape of the power line PSL by the user may be reduced or the shape of the power line PSL may not be recognized by the user.

Meanwhile, as shown in FIG. 9, the circuit element layer (or inorganic layer portion) 111 disposed in the non-pad portion NP may include a first protective layer 111*c* and a second protective layer 111*d*. Also, as shown in FIG. 10, the dummy electrode 114' disposed in the non-pad portion NP may be disposed on the upper surface and the side of the flat portion 113 while being in contact with the first protective layer 111*c*.

Although three second transmissive portions TR2 are formed in each of the gate driver GD and the non-pad portion NP in the direction that is toward the display area DA from the non-display area NDA, at least two second transmissive portions TR2 may be provided the direction that is toward the display area DA from the non-display area NDA. In this case, at least one slit portion SLT may be provided.

In the present disclosure, although the three second transmissive portions TR2 are disposed in a line in the first direction (arrow direction D1) from the non-display area NDA to the display area DA, the present disclosure is not limited thereto, and two or more second transmissive portions TR2, that is, the plurality of second transmissive portions TR2 may be alternately disposed in the direction that is toward the display area DA from the non-display area NDA. When the plurality of second transmissive portions TR2 are alternately disposed in the direction that is toward the display area from the non-display area NDA, the plurality of slit portions SLT may be alternately disposed. In this case, the plurality of slit portions SLT may be partially overlapped or not overlapped in the direction that is toward the display area DA from the non-display area NDA.

According to the present disclosure, the following advantageous effects may be obtained.

In the present disclosure, since the non-display area is provided to include the slit portion, moisture permeation of the non-display area may be avoided or the moisture permeation path may be lengthened, whereby reliability may be improved.

Also, in the present disclosure, as the slit portion is disposed in the non-display area, the organic layer such as the organic light emitting layer or the planarization layer may be disconnected, namely discontinuous, whereby the moisture permeation prevention effect may be increased or maximized.

Also, in the present disclosure, the organic layer such as the planarization layer is provided in the non-display area, the visibility difference with the display area may be reduced.

Also, in the present disclosure, the planarized pixel electrodes (or dummy electrodes) are provided over the GIP line or the plurality of power lines or the plurality of dummy patterns, which are disposed in the non-display area, to overlap each other, whereby reflection visibility for the external light may be improved.

It will be apparent to those skilled in the art that the present disclosure described above is not limited by the above-described embodiments and the accompanying drawings and that various substitutions, modifications and variations may be formed in the present disclosure without departing from the spirit or scope of the disclosures. Consequently, the scope of the coverage provided hereby is defined by the accompanying claims and it is intended that all variations or modifications derived from the meaning, scope and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display apparatus comprising:

a substrate having a display area and a non-display area adjacent to the display area;

a plurality of pixels disposed in the display area, each pixel having a first transmissive portion;

a plurality of second transmissive portions provided in the non-display area;

a slit portion disposed between the plurality of second transmissive portions in the non-display area;

a flat portion disposed in the display area and the non-display area; and a plurality of dummy electrodes on the flat portion in the non-display area, wherein the flat portion in the non-display area is disconnected by the slit portion, and wherein the plurality of dummy electrodes are spaced apart with the slit portion in between.

2. The transparent display apparatus of claim 1, wherein second transmissive portions adjacent to each other are connected to each other at the slit portion.

3. The transparent display apparatus of claim 2, wherein the non-display area includes a plurality of gate driving circuits and a gate driver having a plurality of GIP (gate driver in panel) lines connected to the gate driving circuits, and the slit portion is disposed in the gate driver, and at least a portion of the slit portion overlaps at least one of the plurality of GIP lines.

4. The transparent display apparatus of claim 3, wherein the flat portion is disposed between the plurality of second transmissive portions, the gate driver includes:

an inorganic layer portion overlaying the plurality of GIP lines, made of a plurality of inorganic layers, wherein each of the plurality of dummy electrodes overlaps with a portion of at least one of the plurality of GIP lines on the inorganic layer portion, the dummy electrode is disposed to be adjacent to at least one of the slit portion or the second transmissive portion, and the flat portion is disposed below the dummy electrode.

5. The transparent display apparatus of claim 4, wherein each of the plurality of pixels includes:

a first electrode disposed over the substrate;

an organic light emitting layer provided on the first electrode; and a second electrode disposed on the organic light emitting layer, and the organic light emitting layer is disposed to be extended to the non-display area in which the slit portion is disposed.

6. The transparent display apparatus of claim 5, wherein the slit portion includes an undercut portion disposed between the substrate and the flat portion in the non-display area, and the undercut portion is disposed along an edge of the slit portion.

7. The transparent display apparatus of claim 6, wherein the organic light emitting layer disposed in the non-display area has segments disconnected from each other by the undercut portion.

8. The transparent display apparatus of claim 4, wherein the gate driver further includes a bank covering an edge of the dummy electrode, the flat portion is disposed over the inorganic layer portion, and a portion of the bank is disposed on an upper surface of the flat portion together with the dummy electrode.

9. The transparent display apparatus of claim 4, the inorganic layer portion includes:

a first protective layer disposed over the plurality of GIP lines; and a second protective layer disposed over the first protective layer, the second protective layer is disposed to cover a side and an upper surface of the flat portion disposed on an upper surface of the first protective layer, and a portion of a bank and the dummy electrode are disposed on an upper surface of the second protective layer disposed on an upper surface of the flat portion.

10. The transparent display apparatus of claim 4, wherein the inorganic layer portion includes a protective layer disposed over the GIP line, the flat portion is disposed on the upper surface of the protective layer, the dummy electrode is disposed to cover an upper surface and a side of the flat portion, and a portion of an edge of the dummy electrode is in contact with the protective layer.

11. The transparent display apparatus of claim 10, wherein the gate driver further includes a bank covering the edge of the dummy electrode, and the bank is in contact with the edge of the dummy electrode and the protective layer.

12. The transparent display apparatus of claim 1, wherein each of the plurality of second transmissive portions is connected to at least one slit portion.

13. The transparent display apparatus of claim 1, wherein the slit portion has a width narrower than that of each of the second transmissive portions.

14. The transparent display apparatus of claim 1, wherein a plurality of slit portions are disposed between the plurality of second transmissive portions, the plurality of slit portions include:

a plurality of first slit portions disposed to be elongated in a first direction that is toward the display area from the non-display area; and a plurality of second slit portions disposed to be elongated in a second direction crossing the first slit portions.

15. The transparent display apparatus of claim 14, wherein the plurality of second slit portions are disposed to be connected to each of the plurality of second transmissive portions disposed in the first direction, and the plurality of first slit portions are disposed to be connected to only odd-numbered second transmissive portions or even-numbered second transmissive portions of the plurality of second transmissive portions disposed in the second direction.

16. The transparent display apparatus of claim 15, wherein the plurality of first slit portions are disposed in a zigzag pattern in the second direction.

17. The transparent display apparatus of claim 14, wherein at least a portion of each of the plurality of second slit portions overlap each other in the first direction.

18. A transparent display apparatus comprising:

a substrate having a display area having a plurality of first transmissive portions and a non-display area having a plurality of second transmissive portions near the display area;

a plurality of electrically conductive lines disposed between the plurality of second transmissive portions;

a slit portion partially overlapped with the plurality of electrically conductive lines;

a flat portion disposed in the display area and the non-display area; and a plurality of dummy electrodes on the flat portion in the non-display area, wherein the flat portion in the non-display area is disconnected by the slit portion, and wherein the plurality of dummy electrodes are spaced apart with the slit portion in between.

19. The transparent display apparatus of claim 18, wherein the slit portion is disposed to connect the plurality of second transmissive portions adjacent to each other.

20. The transparent display apparatus of claim 18, wherein the plurality of dummy electrodes are disposed to be spaced apart from each other on the flat portion in the non-display area, wherein the flat portion is disposed between the plurality of second transmissive portions, and wherein each of the dummy electrodes partially overlaps the plurality of electrically conductive lines.

21. The transparent display apparatus of claim 20, wherein the slit portion is disposed between the plurality of dummy electrodes.

22. The transparent display apparatus of claim 20, wherein the slit portion includes an undercut portion disposed between the substrate and the flat portion in the non-display area, and the undercut portion is disposed along an edge of the slit portion.

23. The transparent display apparatus of claim 18, wherein the non-display area includes a plurality of slit portions, the plurality of slit portions include:

a plurality of first slit portions disposed to be elongated in a first direction that is toward the display area from the non-display area; and a plurality of second slit portions disposed to be elongated in a second direction crossing the first slit portion, the plurality of second slit portions are disposed to be connected to each of the plurality of second transmissive portions disposed in the first direction, and the plurality of first slit portions are disposed to be connected to only odd-numbered second transmissive portions or even-numbered second transmissive portions of the plurality of second transmissive portions disposed in the second direction.

24. The transparent display apparatus of claim 23, wherein at least a portion of each of the plurality of second slit portions overlap each other in the first direction.

25. The transparent display apparatus of claim 23, wherein the plurality of first slit portions are arranged in a zigzag shape in the second direction.

26. The transparent display apparatus of claim 18 wherein the plurality of electrically conductive lines are power lines configured to carry power.

27. A transparent display apparatus comprising:

a substrate having a display area having a plurality of first transmissive portions and a non-display area having a plurality of second transmissive portions near the display area;

a plurality of electrically conductive lines disposed between the plurality of second transmissive portions; and a slit portion partially overlapped with the plurality of electrically conductive lines, wherein the plurality of electrically conductive lines are dummy lines that are electrically isolated from a power source.

28. A transparent display apparatus comprising:

a substrate having a display area and a non-display area;

a plurality of first transmissive members in the display area;

a plurality of second transmissive members in the non-display area;

a plurality of electrically conductive lines disposed between the plurality of second transmissive portions;

planarizing layer having portions positioned in the display area and the non-display area;

an electrical conductive layer overlying the planarizing layer in both the display area and the non-display area;

a slit in the planarizing layer in the non-display area that electrically isolates segments of the electrical conductive layer from each other in the non-display area.

* * * * *